(12) United States Patent
Chehade et al.

(10) Patent No.: US 11,212,942 B2
(45) Date of Patent: Dec. 28, 2021

(54) COOLING ARRANGEMENT FOR AUTONOMOUS COOLING OF A RACK

(71) Applicant: OVH, Roubaix (FR)

(72) Inventors: Ali Chehade, Templeuve (FR); Hadrien Bauduin, Villeneuve d'Ascq (FR); Gregory Francis Louis Bauchart, Wattrelos (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/002,201

(22) Filed: Aug. 25, 2020

(65) Prior Publication Data
US 2021/0068300 A1 Mar. 4, 2021

(30) Foreign Application Priority Data

Aug. 26, 2019 (EP) ..................................... 19315103
Nov. 29, 2019 (EP) ..................................... 19315150

(51) Int. Cl.
*H05K 7/20* (2006.01)

(52) U.S. Cl.
CPC ....... *H05K 7/20627* (2013.01); *H05K 7/2079* (2013.01); *H05K 7/20263* (2013.01); *H05K 7/20554* (2013.01); *H05K 7/20736* (2013.01); *H05K 7/20781* (2013.01)

(58) Field of Classification Search
CPC ........... H05K 7/20627; H05K 7/20263; H05K 7/20554; H05K 7/20736
See application file for complete search history.

(56) References Cited

U.S. PATENT DOCUMENTS

| 6,182,742 B1 | 2/2001 | Takahashi et al. |
| 6,729,387 B2 | 5/2004 | Duong et al. |
| 7,149,084 B2 | 12/2006 | Matsushima et al. |
| 7,436,666 B1 | 10/2008 | Konshak |

(Continued)

FOREIGN PATENT DOCUMENTS

| CN | 108323124 A | 7/2018 |
| CN | 106385784 B | 9/2018 |
| WO | 2018/069633 A1 | 4/2018 |

OTHER PUBLICATIONS

European Search Report with regard to the counterpad European Patent Application No. 19315103.2 completed Feb. 4, 2020.

(Continued)

*Primary Examiner* — Mukundbhai G Patel
(74) *Attorney, Agent, or Firm* — BCF LLP

(57) ABSTRACT

A cooling arrangement for autonomous cooling of a rack hosting components and fans comprises a closed loop and an open loop. Liquid cooling is used in the closed loop to transfer heat from heat-generating units of the components to a primary side of a liquid-to-liquid heat exchanger. An air-to-liquid cooling unit is used in the open loop to absorb heat expelled from the rack by the fans. A liquid from a cold supply line is first heated to some degree in the air-to-liquid cooling unit before reaching a secondary side of the liquid-to-liquid heat exchanger. The primary side being hotter than the secondary side, heat is transferred from the primary side to the secondary side of the liquid-to-liquid heat exchanger. The liquid is expelled at a higher temperature from the secondary side to a hot return line.

12 Claims, 14 Drawing Sheets

(56) References Cited

U.S. PATENT DOCUMENTS

| | | | |
|---|---|---|---|
| 7,599,184 B2 | 10/2009 | Upadhya et al. | |
| 7,715,194 B2 | 5/2010 | Brewer et al. | |
| 7,757,506 B2 | 7/2010 | Ellsworth et al. | |
| 7,963,119 B2 | 6/2011 | Campbell et al. | |
| 8,051,897 B2 | 11/2011 | Campbell et al. | |
| 8,250,879 B2 | 8/2012 | Macbain et al. | |
| 8,274,790 B2 | 9/2012 | Campbell et al. | |
| 8,351,200 B2 | 1/2013 | Arimilli et al. | |
| 8,395,896 B2 | 3/2013 | Belady | |
| 8,514,575 B2 | 8/2013 | Goth et al. | |
| 8,687,364 B2 | 4/2014 | Chainer et al. | |
| 8,789,384 B2 | 7/2014 | Eckberg et al. | |
| 8,925,333 B2 | 1/2015 | Campbell et al. | |
| 9,173,324 B2 * | 10/2015 | Campbell | F28F 1/126 |
| 9,291,408 B2 | 3/2016 | Iyengar et al. | |
| 9,295,182 B2 | 3/2016 | Iyengar et al. | |
| 9,313,930 B2 | 4/2016 | Goth et al. | |
| 9,494,371 B2 | 11/2016 | Werner et al. | |
| 9,592,717 B2 | 3/2017 | Katoh | |
| 9,686,891 B2 | 6/2017 | Campbell et al. | |
| 9,769,954 B2 | 9/2017 | Bonnin et al. | |
| 9,943,014 B2 | 4/2018 | Lyon et al. | |
| 10,156,873 B2 | 12/2018 | Shelnutt et al. | |
| 10,202,857 B2 | 2/2019 | Simonds et al. | |
| 10,225,958 B1 | 3/2019 | Gao | |
| 10,244,655 B2 | 3/2019 | Chainer et al. | |
| 2006/0144070 A1 | 7/2006 | Perthold et al. | |
| 2007/0153474 A1 | 7/2007 | Andersen et al. | |
| 2008/0266726 A1 | 10/2008 | Murakami et al. | |
| 2009/0000771 A1 | 1/2009 | Horn et al. | |
| 2009/0262501 A1 | 10/2009 | Claassen et al. | |
| 2011/0265983 A1 | 11/2011 | Pedersen | |
| 2012/0279684 A1 | 11/2012 | Keisling et al. | |
| 2013/0118712 A1 | 5/2013 | Iyengar et al. | |
| 2013/0138252 A1 | 5/2013 | Chainer et al. | |
| 2013/0174421 A1 | 7/2013 | Chainer et al. | |
| 2013/0205822 A1 * | 8/2013 | Heiland | F25D 31/00 62/259.2 |
| 2013/0206364 A1 | 8/2013 | Fehrenbach et al. | |
| 2014/0374072 A1 | 12/2014 | Seewald et al. | |
| 2016/0088768 A1 | 3/2016 | Wang et al. | |
| 2017/0074591 A1 | 3/2017 | Kim et al. | |
| 2017/0181328 A1 * | 6/2017 | Shelnutt | H05K 7/20781 |
| 2017/0241714 A1 | 8/2017 | Stark | |
| 2018/0192552 A1 | 7/2018 | Tan et al. | |
| 2019/0124798 A1 | 4/2019 | Luo et al. | |

OTHER PUBLICATIONS

English Translation of CN108323124 retrieved on Espaceneton Feb. 3, 2020.

English Translation of CN106385784 retrieved on Espacenet on Jan. 31, 2020.

European Search Report with regard to the counterpad European Patent Application No. 19315150.3 completed Apr. 30, 2020.

* cited by examiner

COOLING ARRANGEMENT FOR AUTONOMOUS COOLING OF A RACK

CROSS REFERENCE

The present application claims priority from European Patent Application No. 19315103.2 filed on Aug. 26, 2019, and on European Patent Application No. 19315150.3, filed on Nov. 29, 2019, the entirety of both of which is incorporated by reference herein.

FIELD

The present technology relates to cooling techniques for electronic equipment. In particular, a cooling arrangement for autonomous cooling of a rack is disclosed.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Fans are commonly mounted within equipment racks to provide forced ventilation cooling to rack-mounted equipment. This solution merely displaces some of the heat generated within the racks to the general environment of the data center. Air-to-liquid heat exchangers, finned tubes heat exchangers similar to radiators, may be mounted to the racks to absorb and transport some of this displaced heat to further cooling equipment, for example cooling towers, located outside of the data center. For example, FIG. 1 is a highly schematic perspective view of a server rack on which three (3) air-to-liquid heat exchangers are mounted. A server rack 10 hosts a number of servers (not shown) that generate a significant amount of heat. A number of fans 12 (six fans are shown without limiting the present disclosure) expel heated air from the server rack 10 in a direction of three (3) air-to-liquid heat exchangers 14 mounted behind a backplane 20 of the server rack 10. On FIG. 1, the air-to-liquid heat exchangers 14 are shown in transparent form in order to render the fans 12 visible. The air-to-liquid heat exchangers 14 receive cold liquid, for example water, from a cold liquid line 16 and return heated liquid to a hot liquid line 18. The airflow having passed through the air-to-liquid heat exchangers 14 is somewhat cooled down to allow maintaining an ambient temperature of the data center to a reasonable level.

FIG. 2 is a schematic diagram of a single-flow air-to-liquid heat exchanger. A single-flow heat exchanger 100 comprises a frame 102 and a continuous internal conduit 104. The continuous internal conduit 104 is connected at one end to liquid inlet 106 and at an opposite end to a liquid outlet 108. The liquid inlet 106 is connectable to a supply line such as the cold liquid line 16 for receiving a cold liquid, for example water. The liquid outlet 108 is connectable to a return line such as the hot liquid line 18 for returning the liquid that, in operation, has absorbed heat from an airflow passing through the frame 102. The continuous internal conduit 104 forms a plurality of interconnected parallel sections 110 that extend within the frame 102.

The liquid inlet 106 is connected to a first interconnected parallel section 110. Each interconnected parallel section 110, except a last one, is connected to a next interconnected parallel section 110 via a generally U-shaped section 112 of the continuous internal conduit 104. The last interconnected parallel section 110 is connected to the liquid outlet 108. Liquid received at the liquid inlet 106 flows within the continuous internal conduit 104 in the direction shown by the various arrows until it reaches the liquid outlet 108. Heat from the air flowing through the frame 102 of the air-to-liquid heat exchanger 100 is absorbed at least in part by the liquid flowing through the continuous internal conduit 104.

The single-flow heat exchanger 100 is thin, especially when compared to a thickness of the server rack 10. Given its thinness, the single-flow heat exchanger 100 adds little to the overall space occupancy of the server rack 10 in the data center. The thinness of the single-flow heat exchanger 100 further allows its mounting on the server rack 10 by use of hinges (not shown) so that the single-flow heat exchanger 100 may be moved aside, as when opening a door, to provide access to components present in the backplane 20 of the rack 10.

The frame 102 occupies most of the overall width of single-flow heat exchanger 100, as only the generally U-shaped section 112 of the continuous internal conduit 104 protrude on each side of the frame 102. Consequently, the single-flow heat exchanger 100 offers a broad surface that may be traversed by a flow of air expelled from the server rack 10.

FIG. 3 is a visual representation of a stratified temperature pattern of an airflow expelled from the single-flow air-to-liquid heat exchanger of FIG. 2. A diagram 150 illustrates a temperature of a flow of air measured in an experimental setup, before and after passing through the single-flow heat exchanger 100. The air flows in the direction of arrows 152 and 154. In a first zone 156 upstream of the air-to-liquid heat exchanger 100, a temperature of the airflow is high due to the generation of heat in the server rack 10, being for example at about 40 degrees (all temperatures are in Celsius). The temperature of the airflow is substantially uniform within the first zone 156. Cold liquid is received at the bottom 158 of the single-flow heat exchanger 100, at a temperature of about 25 degrees. Lower strata 160 of the air flowing in a zone 162 downstream of the single-flow heat exchanger 100 are cooled to about 33 degrees. A temperature of the liquid flowing through the single-flow heat exchanger 100 increases as it passes through the various interconnected parallel sections 110, being continuously exposed to the 40 degrees airflow. The liquid reaches about 28 degrees the top 164 of the single-flow heat exchanger 100. Consequently, a topmost section of the single-flow heat exchanger 100 is less efficient in cooling the flow of air in upper strata 166, which are only cooled to about 36 degrees.

This lack of homogeneity of the flow of air expelled from the single-flow heat exchanger 100 causes a plurality of problems.

One problem is that it becomes difficult to place a plurality of server racks 10 in close proximity to one another because the air expelled from a first server rack 10 and aspired by the fans 12 of a second, proximally located server rack 10, is not suitable for efficiently cooling of that second server rack 10. This is particularly the case when it is desired to place a plurality of server racks 12 in front of one another, with the same orientation.

Another problem relates to the monitoring of cooling efficiency. Such monitoring is important as safety measures may need to be applied without delay in case of cooling failure. In the data center, temperature sensors (not shown) are positioned in various places on the server racks 10. When such temperature sensors are mounted on the single-flow heat exchangers 100, slight variations in the placement of these temperatures sensors on the surface of each single-flow heat exchanger 100 may lead to imprecisions that are detrimental to the overall monitoring of the cooling performance. For example when the interconnected parallel sections 110 extend horizontally, as illustrated on FIG. 2, positioning a temperature sensor at different heights on various single-flow heat exchanger 100 may cause to acquire inconsistent measurements.

FIG. 4 is a schematic diagram of a multi-flow air-to-liquid heat exchanger. A multi-flow air-to-liquid heat exchanger 200 comprises a frame 202, a liquid inlet 204 and a liquid outlet 206. The liquid inlet 204 is connected to a first manifold 208 and the liquid outlet 206 is connected to a second manifold 210. The first and second manifolds 208 and 210 are sometimes collectively called a "nurse" because the first manifold 208 feeds a cold liquid received at the liquid inlet 204 to a first plurality of parallel internal conduits 212, each of which is connected to one of a second plurality of parallel internal conduits 214 via a respective U-shaped link 216, the parallel internal conduits 214 being connected to the liquid outlet 206 via the second manifold 210. The first and second manifolds 208 and 210 as illustrated are located outside of the frame 202 and are positioned in an area where an airflow from the server rack 10 is substantially blocked. The first and second manifolds 208 and 210 usually have a diameter that is significantly larger than a diameter of the parallel internal conduits 212 and 214 in order for each of the parallel internal conduits 212 and 214 to be fed with substantially equal liquid flows.

When compared to the single-flow heat exchanger 100, multi-flow air-to-liquid heat exchanger 200 is much less subject to cause a temperature stratification of air flowing therethrough. The multi-flow air-to-liquid heat exchanger 200 however brings other disadvantages.

FIG. 5 is a schematic side-view of the multi-flow air-to-liquid heat exchanger of FIG. 4. On FIG. 5, the air expelled from the server rack 10 flows in a direction of the arrow 220. The frame 202 has an important thickness due to the presence of the first and second manifolds 208 and 210. This thickness may become problematic when mounting a large number of multi-flow air-to-liquid heat exchangers 200 on a respectively large number of server racks 10 in the data center. A same number of server racks 10 will occupy more of the floor space of the data center. It may be noted that the multi-flow air-to-liquid heat exchanger as illustrated on FIGS. 4 and 5 is only a simple example of many possible configurations.

Another disadvantage of the multi-flow air-to-liquid heat exchanger 200, which is also caused by its thickness, is that it cannot conveniently be mounted on the server rack 10 by use of hinges. The multi-flow air-to-liquid heat exchanger 200 needs to be fully dismounted from the server rack 10 to provide access to the backplane 20.

A further disadvantage of the multi-flow air-to-liquid heat exchanger 200 relates to its geometry. The nurse formed by the first and second manifolds 208 and 210 occupies a significant share of the overall surface of the multi-flow air-to-liquid heat exchanger 200, leaving a lesser share of this overall surface that be traversed by a flow of air expelled from the server rack 10, when compared with the single-flow heat exchanger 100.

In addition to the above-mentioned concerns, other concerns relate to the potential failure of cooling equipment, for example due to blockage of liquid conduits. The single-flow heat exchanger 100 and multi-flow air-to-liquid heat exchanger 200 each have a single inlet 106 or 204 and a single outlet 108 or 206, so any blockage of at the level of these inlets and outlets may lead to a complete loss of cooling of the airflow expelled from the server rack 10.

In addition to air-to-liquid heat exchangers, liquid cooling units may be mounted internally in the server rack 10 to directly cool the processors in each server. A non-limiting example of a liquid cooling unit is illustrated on FIG. 6, which is a top plan schematic representation of a water block mounted on a processor of a component. A water block 250 is a liquid cooling heat sink, which is thermally coupled to a component to be cooled, for example on a processor 252 of a component 254 mounted within the server rack 10. Water (or another liquid) is circulated through a conduit in the water block 250 to absorb the heat from the component. As the liquid flows out of the water block 250, so does the heat absorbed thereby. In more details, the shown water block 250 is mounted on the processor 252. FIG. 6 is not to scale; while perimeters of the water block 250 and of the processor 252 may be similar, their relative sizes in view of the shown size of the component 254 are for illustration purposes only.

The water block 250 comprises two redundant liquid inlets 256 and 258 respectively connectable to redundant conduits 260 and 262 (only their ends is shown) for receiving a cooling liquid. The liquid flows through redundant liquid channels 264 and 266 that zigzag within the water block 250 to maximize the heat absorption potential of the liquid across a surface of the water block 250. The liquid channels 264 and 266 terminate at two redundant liquid outlets 268 and 270 that are respectively connectable to redundant conduits 272 and 274 (only their ends are shown) for hot liquid output. In the illustrated example, the liquid is received at the liquid inlets 256 and 258 at about 35 degrees. The liquid is expelled at the liquid outlets 268 and 270 at about 40.5 to 41.5 degrees.

Known solutions combine air-to-liquid heat exchangers and liquid cooling units in an inefficient manner. While liquid cooling units can efficiently operate with fairly high inlet liquid temperatures, for example 50 degrees, it is desired to maintain a lower ambient air temperature in the datacenter, for example to less than 35 degrees. Supplying liquid at up to 50 degrees to air-to-liquid heat exchangers cannot allow reducing the ambient air temperature to a desired level. Supplying liquid at a much lower inlet temperature, for example 35 degrees, to liquid cooling units would require expensive external liquid cooling equipment.

Liquid flowing in and out of the water blocks 250 or in and out of other liquid cooling units installed in a large number of server racks 10 is conventionally pumped by large pumps and is directed to outside equipment, for example toward cooling towers. In a large computing facility comprising thousands of water blocks 250 that are ultimately fed by a single pump, proper flow control to ensure a sufficient cooling flow in each individual water block 250 may be an unmanageable task. It is also difficult to scale the system because of the presence of large pumps, large reservoirs, and other large pieces of equipment. The use of large pumps and other large equipment greatly increases the cost of the cooling infrastructure. When there is a desire to provide cooling redundancy, the cost of providing redundancy rapidly becomes prohibitive, as is the number and space occupancy of redundant piping elements disposed in all parts of the computing facility.

There is thus a desire to provide an autonomous cooling solution for each server rack 10. There is also a desire tor provide cooling redundancy implemented at the level of a single server rack 10.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) the difficulty in scaling the cooling infrastructure; (2) the cost of the cooling infrastructure and/or (3) the cost of providing redundancy in the cooling infrastructure.

In one aspect, various implementations of the present technology provide a cooling arrangement for autonomous cooling of a rack hosting at least one component and at least one fan, characterized in that the cooling arrangement comprises:
  a first closed loop comprising:
    at least one liquid cooling unit thermally coupled to a heat-generating unit of the at least one component, the at least one liquid cooling unit comprising a first liquid channel adapted for transferring heat from the heat-generating unit to a first liquid flowing in the first liquid channel,
    a first primary side of a first liquid-to-liquid heat exchanger, the first primary side being fluidly connected to the first liquid channel of the at least one liquid cooling unit, and
    a first pump fluidly connected between the first primary side of the first liquid-to-liquid heat exchanger and the at least one liquid cooling unit, the first pump being adapted for causing the first liquid to flow within the first closed loop;
  a first open loop comprising:
    a first air-to-liquid heat exchanger mounted to the rack so that heated air expelled from the rack by the at least one fan flows through the first air-to-liquid heat exchanger, the first air-to-liquid heat exchanger being adapted to receive a second liquid from a first cold supply line, and
    a first secondary side of the first liquid-to-liquid heat exchanger, the first secondary side being thermally coupled to the first primary side for transfer of heat from the first primary side to the first secondary side when a temperature of the first primary side is higher than a temperature of the first secondary side, the first secondary side being fluidly connected to the first air-to-liquid heat exchanger, the first secondary side being adapted for returning the second liquid to a first hot return line.

In some implementations of the present technology, the first cold supply line is adapted for being connected to a cold outlet of a dry cooler and the first hot return line is adapted for being connected to a hot inlet of the dry cooler.

In some implementations of the present technology, the first liquid channel of the at least one liquid cooling unit extends between a first liquid inlet and a first liquid outlet of the at least one liquid cooling unit, the first primary side of the first liquid-to-liquid heat exchanger comprises a second liquid inlet fluidly connected to the first liquid outlet of the at least one liquid cooling unit, the first primary side further comprising a second liquid outlet fluidly connected to the first liquid inlet of the at least one liquid cooling unit, the first air-to-liquid heat exchanger comprises a third liquid inlet adapted to receive the second liquid from the first cold supply line, the first air-to-liquid heat exchanger further comprising a third liquid outlet, and the first secondary side of the first liquid-to-liquid heat exchanger comprises a fourth liquid inlet fluidly connected to the third liquid outlet of the first air-to-liquid heat exchanger and a fourth liquid outlet adapted for returning the second liquid to the first hot return line.

In some implementations of the present technology, the rack has a generally rectangular perimeter, the first air-to-liquid heat exchanger being positioned on a first side of the rack, the cooling arrangement further comprising a subframe adapted to be mounted on a second side of the rack perpendicular to the first side, the subframe being configured to receive the first liquid-to-liquid heat exchanger, the first pump being connected to the second liquid inlet of the first primary side of the first liquid-to-liquid heat exchanger, a first valve within a connection extending from the first liquid outlet of the at least one liquid cooling unit to the first pump, a second valve within a fluid connection extending from the second liquid outlet of the first primary side of the first liquid-to-liquid heat exchanger to the first liquid inlet of the at least one liquid cooling unit, a third valve within a fluid connection extending from the third liquid outlet of the first air-to-liquid heat exchanger to the fourth liquid inlet of the first secondary side of the first liquid-to-liquid heat exchanger, and a fourth valve within a fluid connection extending from the fourth liquid outlet of the first secondary side of the first liquid-to-liquid heat exchanger to the first hot return line.

In some implementations of the present technology, the cooling arrangement further comprises a second closed loop comprising a second liquid channel of the at least one liquid cooling unit, the second liquid channel being adapted for transferring heat from the heat-generating unit to a third liquid flowing in the second liquid channel, a second primary side of a second liquid-to-liquid heat exchanger, the second primary side being fluidly connected to the second liquid channel of the at least one liquid cooling unit, and a second pump fluidly connected between the second primary side of the second liquid-to-liquid heat exchanger and the at least one liquid cooling unit, the second pump being adapted for causing the third liquid to flow within the second closed loop, and a second open loop comprising a second air-to-liquid heat exchanger mounted to the rack so that air having flowed through the first air-liquid heat exchanger flows through the second air-to-liquid heat exchanger, the second air-to-liquid heat exchanger being adapted to receive a fourth liquid from the first cold supply line or from a second cold supply line, and a second secondary side of the second liquid-to-liquid heat exchanger, the second secondary side being thermally coupled to the second primary side for transfer of heat from the second primary side to the second secondary side when a temperature of the second primary side is higher than a temperature of the second secondary side, the second secondary side being fluidly connected to the second air-to-liquid heat exchanger, the second secondary side being adapted for returning the fourth liquid to the first hot return line or to a second hot return line.

In some implementations of the present technology, the second liquid channel of the at least one liquid cooling unit extends between a fifth liquid inlet and a fifth liquid outlet of the at least one liquid cooling unit, the second primary side of the second liquid-to-liquid heat exchanger comprises a sixth liquid inlet fluidly connected to the fifth liquid outlet of the at least one liquid cooling unit, the second primary side further comprising a sixth liquid outlet fluidly connected to the fifth liquid inlet of the at least one liquid cooling unit, the second air-to-liquid heat exchanger comprises a seventh liquid inlet adapted to receive the fourth liquid from the first cold supply line or from the second cold supply line, the second air-to-liquid heat exchanger further comprising a seventh liquid outlet, and the second secondary side of the second liquid-to-liquid heat exchanger comprises an eighth liquid inlet fluidly connected to the seventh liquid outlet of the second air-to-liquid heat exchanger and an eighth liquid outlet adapted for returning the second liquid to the first hot return line or to the second hot return line.

In some implementations of the present technology, the rack has a generally rectangular perimeter, the first air-to-liquid heat exchanger being positioned on a first side of the rack, the cooling arrangement further comprising a subframe adapted to be mounted on a second side of the rack perpendicular to the first side, the subframe being configured to receive a first module comprising the first liquid-to-liquid heat exchanger, the first pump being connected to the second liquid inlet of the first primary side of the first liquid-to-liquid heat exchanger, a first valve within a connection extending from the first liquid outlet of the at least one liquid cooling unit to the first pump, a second valve within a fluid connection extending from the second liquid outlet of the first primary side of the first liquid-to-liquid heat exchanger to the first liquid inlet of the at least one liquid cooling unit, a third valve within a fluid connection extending from the third liquid outlet of the first air-to-liquid heat exchanger to the fourth liquid inlet of the first secondary side of the first liquid-to-liquid heat exchanger, and a fourth valve within a fluid connection extending from the fourth liquid outlet of the first secondary side of the first liquid-to-liquid heat exchanger to the first hot return line, and a second module comprising the second liquid-to-liquid heat exchanger, the second pump being connected to the sixth liquid inlet of the second primary side of the second liquid-to-liquid heat exchanger, a fifth valve within a connection extending from the fifth liquid outlet of the at least one liquid cooling unit to the second pump, a sixth valve within a fluid connection extending from the sixth liquid outlet of the second primary side of the second liquid-to-liquid heat exchanger to the fifth liquid inlet of the at least one liquid cooling unit, a seventh valve within a fluid connection extending from the seventh liquid outlet of the second air-to-liquid heat exchanger to the eighth liquid inlet of the second secondary side of the second liquid-to-liquid heat exchanger, and an eighth valve within a fluid connection extending from the eighth liquid outlet of the second secondary side of the second liquid-to-liquid heat exchanger to the first hot return line or to the second hot return line.

In some implementations of the present technology, the first closed loop and the first open loop are taken out of service by closing the first, second, third and fourth valves and by turning off the first pump, and the second closed loop and the second open loop are taken out of service by closing the fifth, sixth, seventh and eighth valves and by turning off the second pump.

In some implementations of the present technology, the first closed loop and the first open loop are configured to provide sufficient cooling for maintaining a temperature of the at least one component to less than a safe temperature threshold when the second closed loop and the second closed loop are taken out of service, the second closed loop and the second open loop are configured to provide sufficient cooling for maintaining the temperature of the at least one component to less than the safe temperature threshold when the first closed loop and the first open loop are taken out of service.

In some implementations of the present technology, the first liquid-to-liquid heat exchanger is a plate heat exchanger.

In some implementations of the present technology, the second liquid-to-liquid heat exchanger is a plate heat exchanger.

In some implementations of the present technology, the rack comprises a plurality of server housings, each of the server housing hosting at least one component, the at least one fan comprises at least one fan mounted in each of the server housings, the first open loop comprises a plurality of air-to-liquid heat exchangers mounted to the rack so that heated air expelled by the at least one fan of each server housing flows through a corresponding one of the plurality of air-to-liquid heat exchangers, each of the plurality of air-to-liquid heat exchangers is adapted to receive liquid from the first cold supply line, and the first secondary side of the first liquid-to-liquid heat exchanger is fluidly connected to each of the plurality of air-to-liquid heat exchangers.

In some implementations of the present technology, the at least one component comprises a plurality of components hosted in the rack, each of the plurality of components comprising one or more heat-generating units, the at least one liquid cooling unit comprises a plurality of liquid cooling units, each of the plurality of liquid cooling units being thermally coupled to a corresponding one of the one or more heat-generating units of each of the plurality of components, each of the plurality of liquid cooling units is fluidly connected to the first primary side of the first liquid-to-liquid heat exchanger, and the first pump is fluidly connected between the first primary side of the first liquid-to-liquid heat exchanger and each of the plurality of liquid cooling units, the first pump being further adapted for causing liquid to flow between the first primary side of the first liquid-to-liquid heat exchanger and each of the plurality of liquid cooling units.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

An aspect of the present technology introduces a cooling arrangement for autonomous cooling of a rack, for example a server rack, hosting at least one heat generating component and at least one fan. The cooling arrangement comprises a closed loop and an open loop. The closed loop provides liquid cooling for the heat generating component. The open loop provides cooling for air expelled from the rack by the at least one fan. A cold liquid, for example water, is fed to the open loop and is brought to a warm temperature by the air expelled by the rack. The warm liquid is then fed to a heat exchanger at a junction between the open loop and the closed loop. A hotter liquid of the closed loop is cooled by thermal transfer from the closed loop to the open loop in the heat exchanger. The liquid from the open loop, which has increased in temperature, is expelled from the open loop.

With these fundamentals in place, we will now consider some non-limiting examples to illustrate various implementations of aspects of the present technology.

Figure 7:
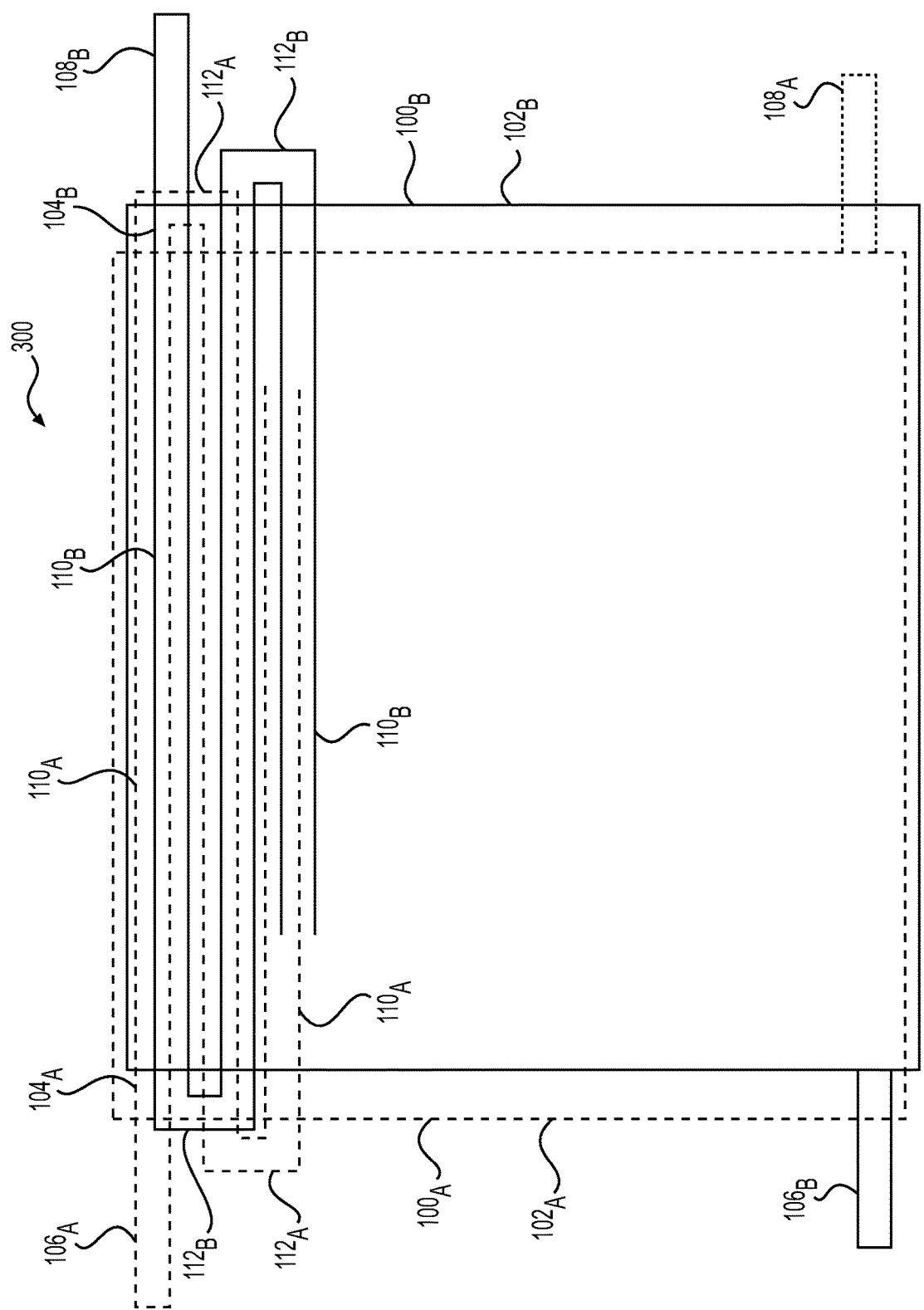
FIG. 7 is a highly schematic representation of a pair of air-to-liquid heat exchangers assembled in an anti-parallel configuration in accordance with an embodiment of the present technology.

FIG. 7 is a highly schematic representation of a pair of air-to-liquid heat exchangers assembled in an anti-parallel configuration in accordance with an embodiment of the present technology. A cooling arrangement 300 that may be mounted on a rack hosting electronic equipment and at least one fan, for example the server rack 10 having the fans 12, comprises at least a pair of air-to-liquid heat exchangers, for example and without limitation, a pair of single-flow heat exchangers 100 as introduced in the description of FIG. 2. With continued reference to FIG. 7, also considering FIGS. 1 and 2, an air-to-liquid heat exchanger $100_A$ is shown in dotted lines and another air-to-liquid heat exchanger $100_B$ is shown in solid lines. On FIG. 7, the air-to-liquid heat exchangers $100_A$ and $100_B$ are shown as being mounted at an offset from one another; this illustration is solely intended to render visible various parts of the air-to-liquid heat exchangers $100_A$ and $100_B$. In a practical application, the air-to-liquid heat exchangers $100_A$ and $100_B$ may be aligned so that there is no discernable offset therebetween.

The air-to-liquid heat exchanger $100_A$ is mounted to the server rack 10 so that heated air expelled from the server rack 10 by the one or more fans 12 flows through the air-to-liquid heat exchanger $100_A$. The air-to-liquid heat exchanger $100_A$ comprises a frame $102_A$, a liquid inlet $106_A$ mounted to the frame $102_A$ for receiving liquid from a cold supply line, a liquid outlet $108_A$ mounted to the frame $102_A$ for returning liquid to a hot return line, and a continuous internal conduit $104_A$. The continuous internal conduit $104_A$ forms a plurality of interconnected parallel sections $110_A$ (only some are shown) extending within the frame $102_A$. Examples of the cold supply line and of the hot return line are shown on later Figures.

The continuous internal conduit $104_A$ connects the liquid inlet $106_A$ to the liquid outlet $108_A$. In more details, a one of the plurality of interconnected parallel sections $110_A$ is connected to the liquid inlet $106_A$. Then, each one of the plurality of interconnected parallel sections $110_A$ except a last one is connected to a next one of the plurality of interconnected parallel sections $110_A$ via one of a plurality of U-shaped sections $112_A$ of the continuous internal conduit $104_A$. The last one of the plurality of interconnected parallel sections $110_A$ is connected to the liquid outlet $108_A$.

The air-to-liquid heat exchanger $100_B$ is mounted to the air-to-liquid heat exchanger $100_A$ so that air having flowed through the air-to-liquid heat exchanger $100_A$ flows through the air-to-liquid heat exchanger $100_B$. The air-to-liquid heat exchanger $100_B$ comprises a frame $102_B$, a liquid inlet $106_B$ mounted to the frame $102_B$ and adapted to receive liquid from the same cold supply line or from another cold supply line, a liquid outlet $108_B$ mounted to the frame $102_B$ and adapted to return liquid to the same hot return line or to another hot return line, and a continuous internal conduit $104_B$ forming a plurality of interconnected parallel sections $110_B$ (only some are shown) extending within the frame $102_B$.

The continuous internal conduit $104_B$ connects the liquid inlet $106_B$ to the liquid outlet $108_B$. In more details, a one of the plurality of interconnected parallel sections $110_B$ is connected to the liquid inlet $106_B$. Then, each one of the plurality of interconnected parallel sections $110_B$ except a last one is connected to a next one of the plurality of interconnected parallel sections $110_B$ via one of a plurality of U-shaped sections $112_B$ of the continuous internal conduit $104_B$. The last one of the plurality of interconnected parallel sections $110_B$ is connected to the liquid outlet $108_B$. The air-to-liquid heat exchangers ($100_A$, $100_B$) are assembled in an anti-parallel configuration in the sense that liquid flows in opposite directions in their respective liquid parallel sections ($110_A$, $110_B$).

FIG. 7 illustrates a particular configuration in which the liquid inlet $106_A$ and the liquid outlet $108_A$ are connected on opposite sides of the frame $102_A$, the continuous internal conduit $104_A$ forming an even number of interconnected parallel sections $110_A$ while the continuous internal conduit $104_B$ forms an even number of interconnected parallel sections $110_B$. Likewise, the liquid inlet $106_B$ and the liquid outlet $108_B$ are connected on opposite sides of the frame $102_B$. As illustrated, the interconnected parallel sections $110_A$ and $110_B$ extend horizontally. This is just one of many possible configurations. For instance, the interconnected parallel sections $110_A$ and $110_B$ may extend vertically. Some other configurations will be illustrated hereinbelow.

The air-to-liquid heat exchangers $100_A$ and $100_B$ are mounted to the server rack 10 so that the frame $102_A$ is parallel and adjacent to the frame $102_B$. One of the plurality of interconnected parallel sections $110_A$ of the continuous internal conduit $104_A$ nearest to the liquid inlet $106_A$ is proximate one of the plurality of interconnected parallel sections $110_B$ of the continuous internal conduit $104_B$ nearest to the liquid outlet $108_B$. Otherwise stated, among the plurality of interconnected parallel sections $110_A$, the one interconnected parallel section $110_A$ that is closest to the liquid inlet $106_A$ is also the one interconnected parallel section $110_A$ that is closest to the one interconnected parallel section $110_B$ that is closest to the liquid outlet $108_B$.

The one of the plurality of interconnected parallel sections $110_A$ of the continuous internal conduit $104_A$ nearest to the liquid inlet $106_A$ and the one of the plurality of interconnected parallel sections $110_B$ of the continuous internal conduit $104_B$ nearest to the liquid outlet $108_B$ may be directly facing each other when viewed in a general direction of an airflow expelled from the server rack 10. Alternatively, one of these parallel sections $110_A$ or $110_B$ may be positioned slightly higher or lower than the other. Precise placement of the one of the plurality of interconnected parallel sections $110_A$ of the continuous internal conduit $104_A$ nearest to the liquid inlet $106_A$ in relation to the proximate one of the plurality of interconnected parallel sections $110_B$ of the continuous internal conduit $104_B$ nearest to the liquid outlet $108_B$ may depend on the construction of the air-to-liquid heat exchangers $100_A$ and $100_B$ and on manufacturing tolerances. Minor variations on the placement of the parallel sections $110_A$ and $110_B$ within the cooling arrangement 300 are not expected to have a significant impact on the cooling performance.

Given any one of these configurations, a topmost strata of the airflow expelled from the server rack 10 flows within the air-to-liquid heat exchanger $100_A$ around its topmost interconnected parallel sections $110_A$ in which the liquid flowing through the continuous internal conduit $104_A$ is coolest, being closest to the liquid inlet $106_A$. The topmost strata of the airflow then flows within the air-to-liquid heat exchanger $100_B$ around its topmost interconnected parallel sections $110_B$ in which the liquid flowing through the continuous internal conduit $104_B$ is warmest, being closest to the liquid outlet $108_B$. Conversely, a bottommost strata of the airflow expelled from the server rack 10 flows within the air-to-liquid heat exchanger $100_A$ around its bottommost interconnected parallel sections $110_A$ in which the liquid flowing through the continuous internal conduit $104_A$ is warmest, being closest to the liquid outlet $108_A$. The bottommost strata of the airflow then flows within the air-to-liquid heat exchanger $100_B$ around its bottommost interconnected parallel sections $110_B$ in which the liquid flowing through the continuous internal conduit $104_B$ is coolest, being closest to the liquid inlet $106_B$. An equivalent result may be obtained by positioning the liquid inlet $106_A$ and the liquid outlet $108_B$ at the bottom of the cooling arrangement 300, also positioning the liquid outlet $108_A$ and the liquid inlet $106_B$ at the top of the cooling arrangement 300. Rotating the cooling arrangement 300 so that the interconnected parallel sections $110_A$ and $110_B$ extend vertically is also contemplated.

This effect is spread to all strata of the airflow, each of which gradually receive less cooling from the air-to-liquid heat exchanger $100_A$ along their distribution from the topmost strata toward the bottommost strata, gradually receiving more cooling from the air-to-liquid heat exchanger $100_B$ along the same distribution.

Figure 1:
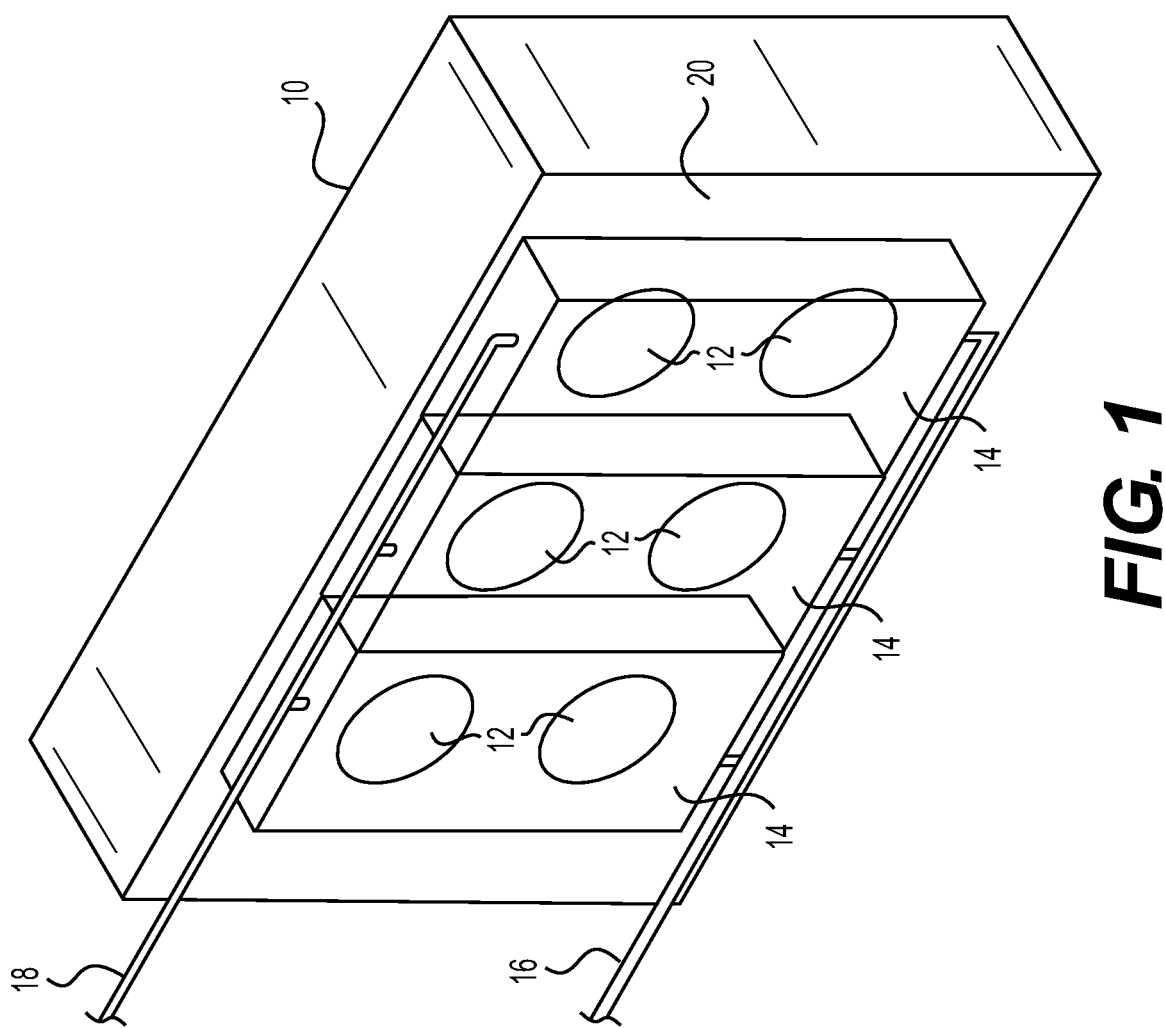
FIG. 1 is a highly schematic perspective view of a server rack on which three (3) air-to-liquid heat exchangers are mounted.
Figure 2:
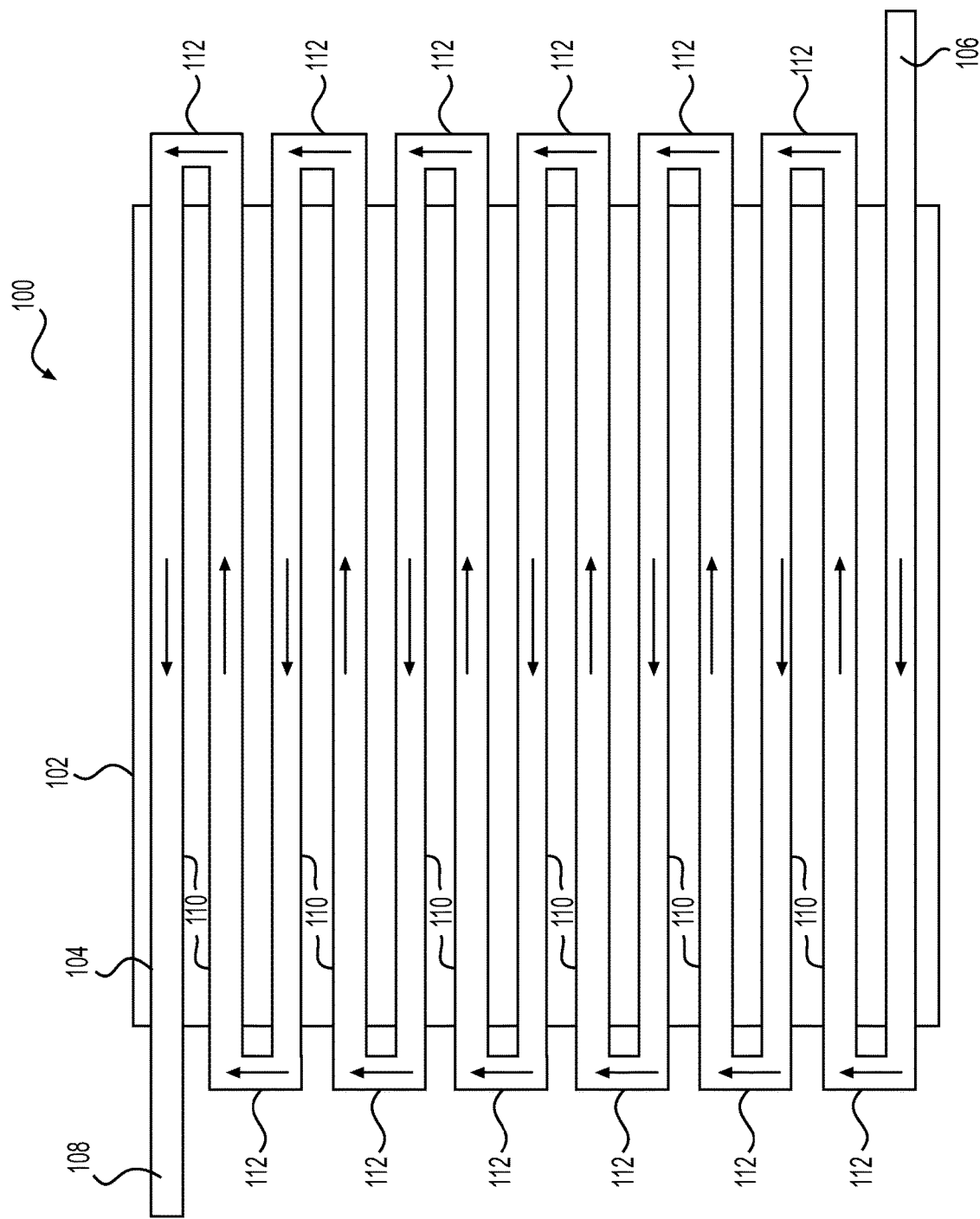
FIG. 2 is a schematic diagram of a single-flow air-to-liquid heat exchanger.
Figure 8:
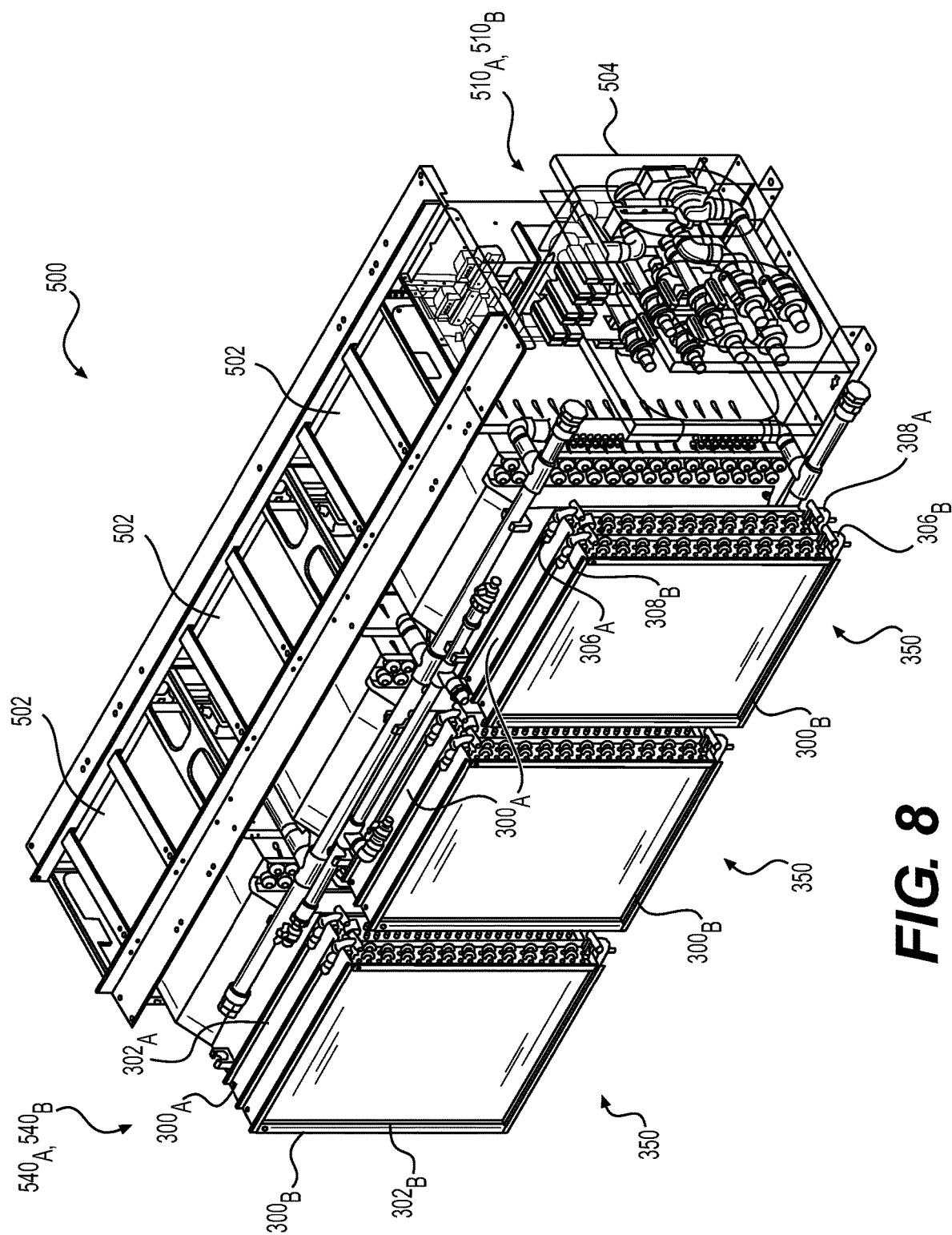
FIG. 8 is a rear perspective view of a server rack having an autonomous and redundant cooling arrangement including a pair of closed loops and a pair of open loops in accordance with an embodiment of the present technology.
Figure 9:
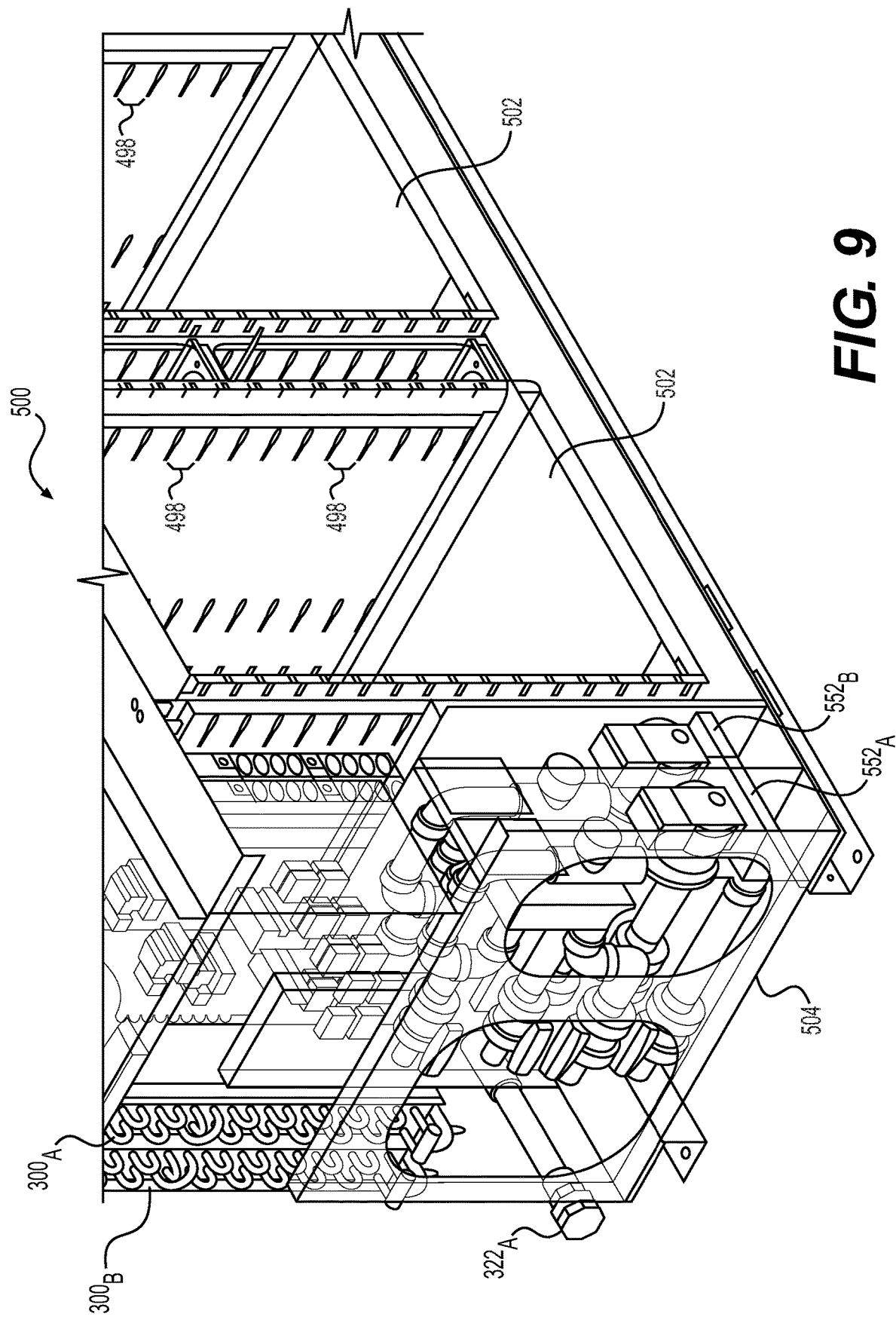
FIG. 9 is a partial, front perspective view of the server rack of FIG. 8.
Figure 10:
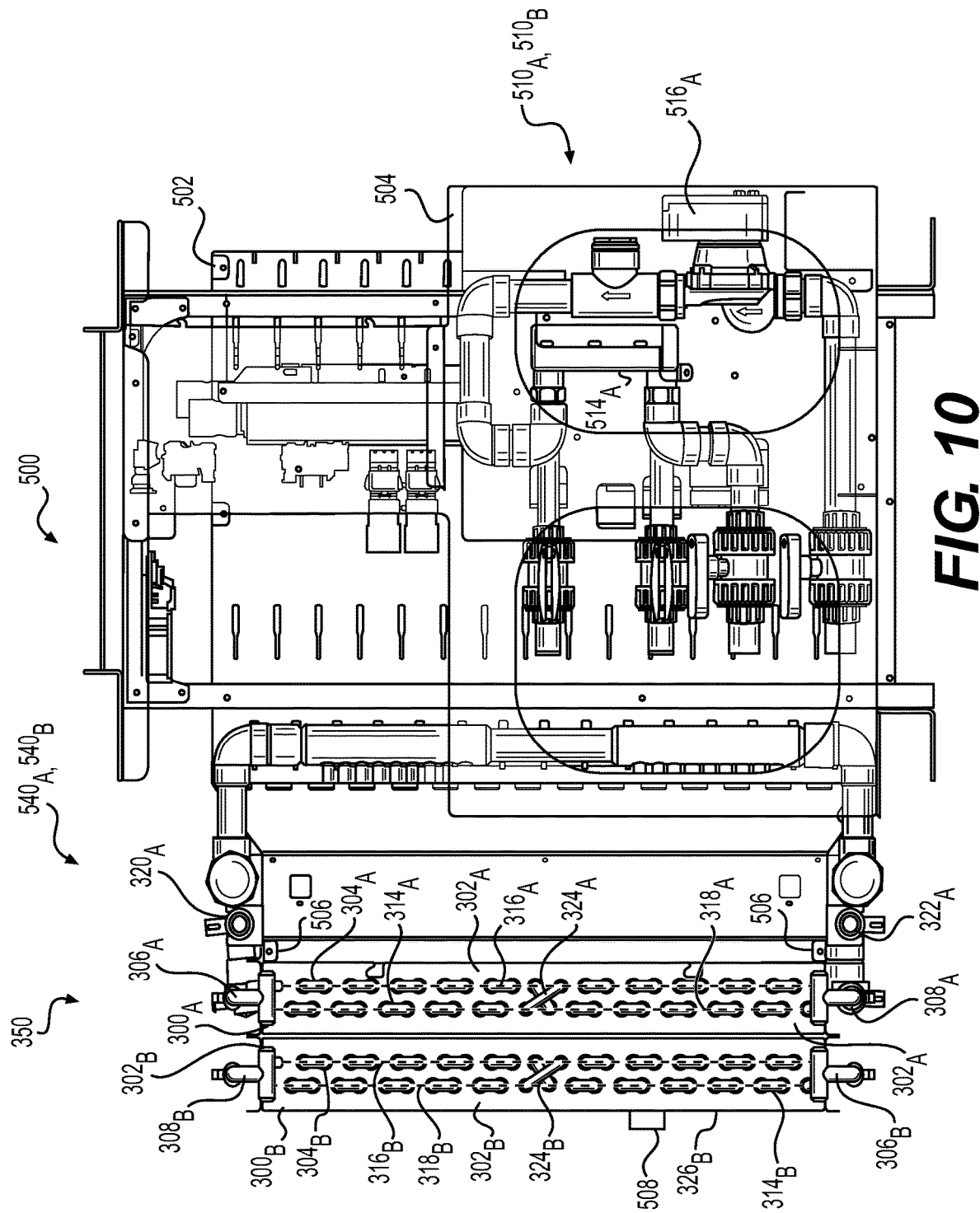
FIG. 10 is a side elevation view of the server rack of FIGS. 8 and 9 in accordance with an embodiment of the present technology.
Figure 11:
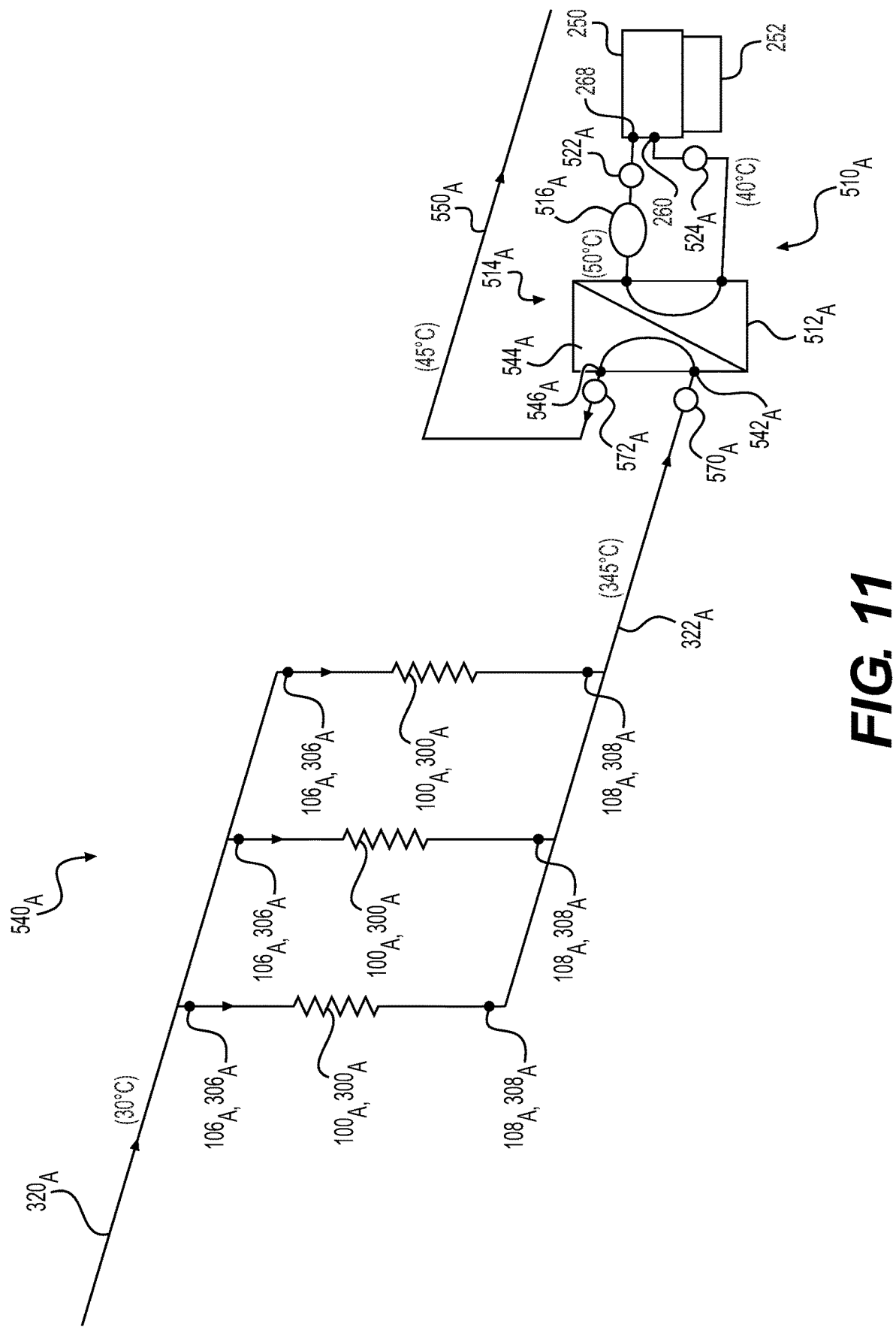
FIG. 11 is a highly schematic illustration of a cooling arrangement having a closed loop including a liquid cooling unit and an open loop including air-to-liquid heat exchangers.

FIG. 8 is a rear perspective view of a server rack having an autonomous and redundant cooling arrangement including a pair of closed loops and a pair of open loops in accordance with an embodiment of the present technology. FIG. 9 is a partial, front perspective view of the server rack of FIG. 8. FIG. 10 is a side elevation view of the server rack of FIGS. 8 and 9 in accordance with an embodiment of the present technology. FIG. 11 is a highly schematic illustration of a cooling arrangement having a closed loop including a liquid cooling unit and an open loop including air-to-liquid heat exchangers. A server rack 500 has a plurality of server housings 502 (three are shown), each of which includes at least one fan 12 (FIG. 1). Each server housing 502 may host a plurality of components 254, for example servers, network switches, power distribution units and other electric or electronic devices, mounted via the front of the server rack 500 in respective stages 498 of the server housings 502. One or more processors 252 or other heat-generating units, such as graphical processor units, random-access memory devices, hard disk drives, may be mounted on each component 254. A water block 250 or another cooling unit, for example a heat pipe, may be mounted on each heat-generating unit. A cooling arrangement 350 is mounted on the rack 500. The cooling arrangement 350 provides autonomous cooling for the rack 500. In a datacenter, a plurality of cooling arrangements 350 may independently provide cooling for a plurality of corresponding racks 500.

The cooling arrangement 350 as shown comprises two closed loops $510_A$ and $510_B$ operatively and fluidly connected to two corresponding open loops $540_A$ and $540_B$. In the non-limiting embodiment of FIGS. 8, 9 and 10, the rack 500 has a generally rectangular perimeter. Most components of the open loops $540_A$ and $540_B$ are mounted on a rear side of the rack 500. Most components of the closed loops $510_A$ and $510_B$ are mounted in a subframe 504 mounted on a lateral side of the rack perpendicular to the rear side.

The cooling arrangement 350 includes two closed loops $510_A$ and $510_B$ and two open loops $540_A$ and $540_B$ for redundancy purposes. Each pair comprising one closed loop $510_A$ or $510_B$ and one corresponding open loop $540_A$ or $540_B$ may provide sufficient cooling capacity to maintain all components 254 hosted in the rack 500 to less than a safe temperature threshold when the other closed loop and the other open loop are taken out of service, so to provide full and complete cooling redundancy for the rack 500. Cooling arrangements including only one closed loop and one open loop, or including two closed loops and only one open loop, or including one closed loop and two open loops, are also contemplated in applications where redundancy is a less important concern.

The two closed loops $510_A$ and $510_B$ are substantially identical and the closed loop $510_A$ will first be described. The closed loop $510_A$ comprises at least one liquid cooling unit, for example a water block 250, thermally coupled to a heat-generating unit, for example a processor 252 of at least one component 254, for example a server, mounted in the rack 500. Each water block 250 comprises a liquid channel 264 in which a liquid, for example water, may flow. Heat generated by the processor 262 is transferred to the liquid flowing in the liquid channel 264. The closed loop $510_A$ comprises a primary side $512_A$ of a liquid-to-liquid heat exchanger $514_A$. In an embodiment, the liquid-to-liquid heat exchanger $514_A$ is a plate heat exchanger. The primary side $512_A$ is fluidly connected to the liquid channel 264 of the at least water block 250. A pump $516_A$ is fluidly connected between the at least one water block 250 and the primary side $512_A$ of the liquid-to-liquid heat exchanger $514_A$. The pump $516_A$ maintains a flow of the liquid circulating within the closed loop $510_A$. Positioning the pump $516_A$ at the level of the subframe 504 for serving one rack 500 allows to easily manage a flow rate of the cooling liquid in the water blocks 250.

Figure 6:
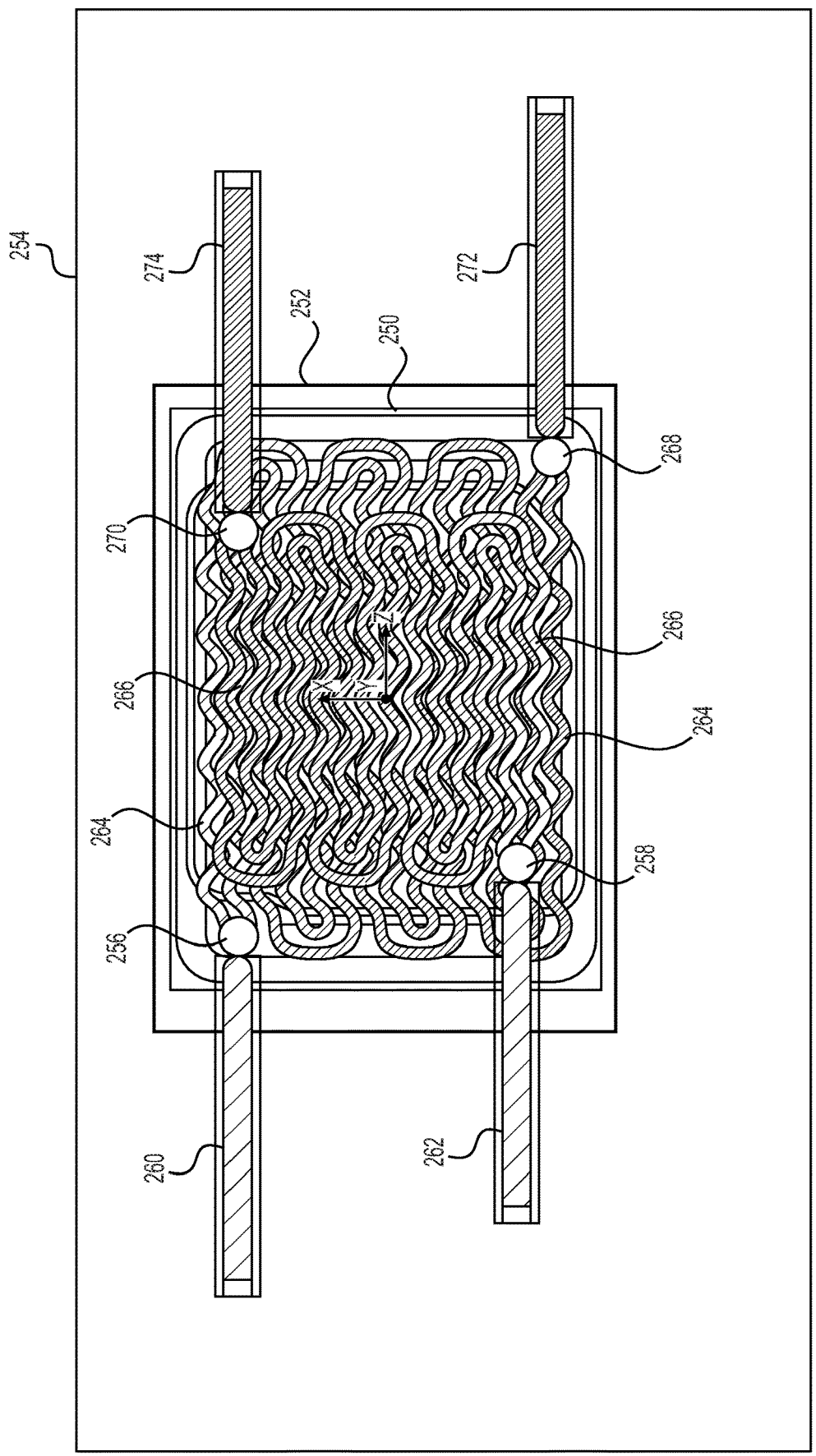
FIG. 6 is a top plan schematic representation of a water block.

In more details, the primary side $512_A$ of the liquid-to-liquid heat exchanger $514_A$ comprises a liquid inlet $518_A$ fluidly connected to the liquid outlet 268 of the water block 250, via the pump $516_A$, and a liquid outlet $520_A$ fluidly connected to the liquid inlet 260 of the water block 250. As shown on FIG. 6, the liquid channel 264 extends between the liquid inlet 260 and the liquid outlet 268 of the water block 250. A valve $522_A$ is provided within the connection that extends from the liquid outlet 268 of the water block 250 to the pump $516_A$. Another valve $524_A$ is provided within the connection that extends from the liquid outlet $520_A$ of the primary side $512_A$ to the liquid inlet 260 of the water block 250. The valves $522_A$ and $524_A$ may be closed when it is desired to take the closed loop $510_A$ out of service, for example for maintenance purposes. The pump $516_A$ should be turned off when the valves $522_A$ and $524_A$ are closed.

Figure 12:
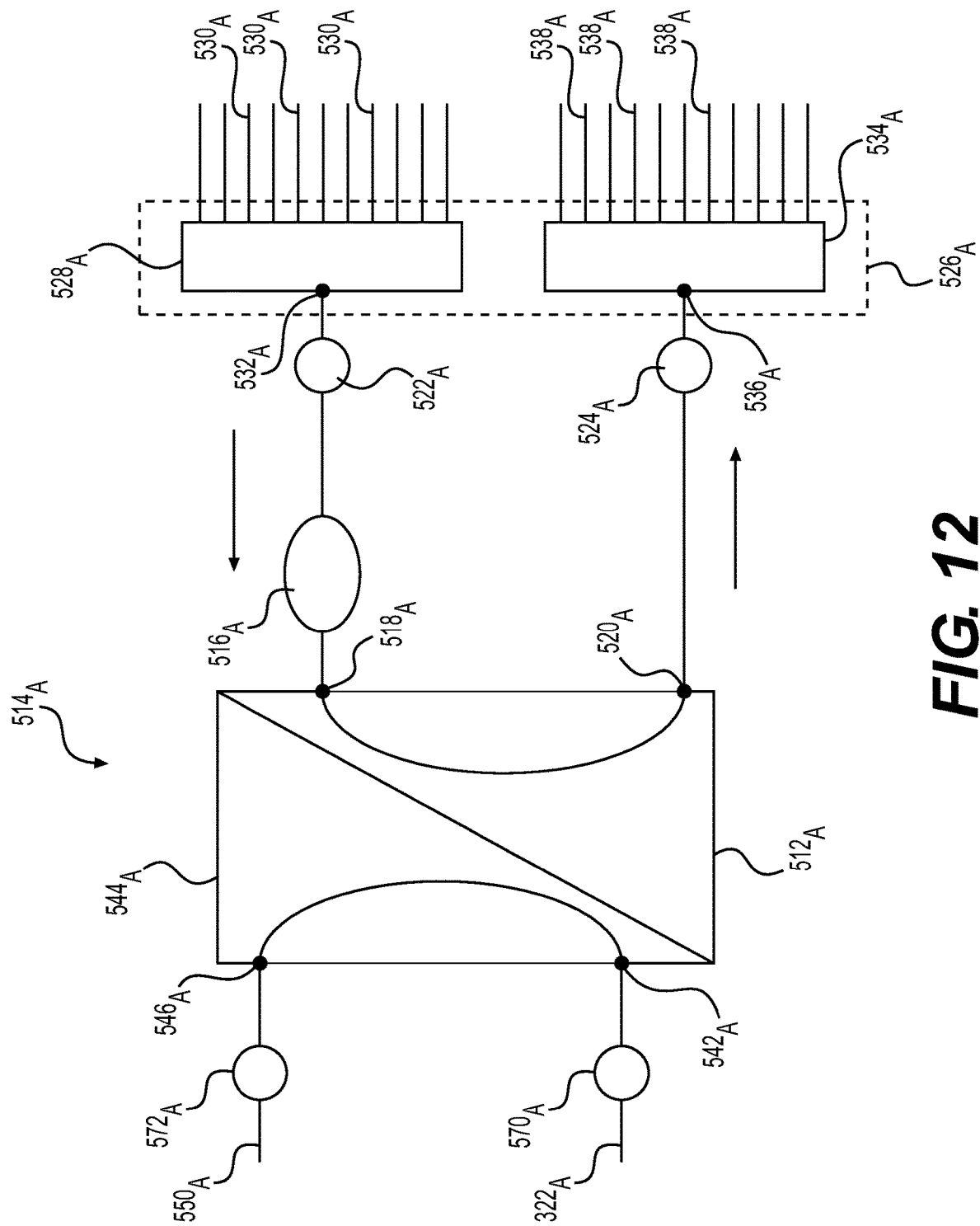
FIG. 12 is a schematic block diagram of a manifold connection between a plurality of water blocks, a pump and a liquid-to-liquid heat exchanger.

The primary side $512_A$ of the liquid-to-liquid heat exchanger $514_A$ may be connected to a plurality of water blocks 250 that are each thermally coupled to a corresponding processor 252 or other heat-generating unit. FIG. 12 is a schematic block diagram of a manifold connection between a plurality of water blocks, a pump and a liquid-to-liquid heat exchanger. Within the closed loop $510_A$, a manifold $526_A$ includes a multi-port inlet $528_A$ having a plurality of ports $530_A$ connectable to the liquid outlets 268 of a plurality of water blocks 250 and one port $532_A$ connectable to the valve $522_A$ for delivering hot liquid from the water blocks 250 to the primary side $512_A$ of the liquid-to-liquid heat exchanger $514_A$ via the pump $516_A$. The manifold $526_A$ also includes a multi-port outlet $534_A$ having a port $536_A$ for receiving, via the valve $524_A$, liquid having been cooled by the liquid-to-liquid heat exchanger $514_A$. The multi-port outlet $534_A$ also includes a plurality of ports $538_A$ for delivering this liquid to the liquid inlets 260 of the water block 250.

The closed loop $510_B$ is constructed in the same manner as the closed loop $510_A$ and includes the same or equivalent components. Within the closed loop $510_B$, a respective primary side of a respective liquid-to-liquid heat exchanger $514_B$, for example another plate heat exchanger, is fluidly connected to the liquid inlet 258 and to the liquid outlet 270 of each water block 250, a respective pump $516_B$ ensuring a flow of liquid in the liquid channel 266 of each water block 250. Within the closed loop $510_B$, the respective liquid-to-liquid heat exchanger $514_B$ comprises a liquid inlet and a liquid outlet as described hereinabove. The closed loop $510_B$ also comprises a respective manifold as present in the closed loop $510_A$. Respective valves $522_B$ and $524_B$ similar to those present in the closed loop $510_A$ may be closed when it is desired to take the closed loop $510_B$ out of service.

Figure 4:
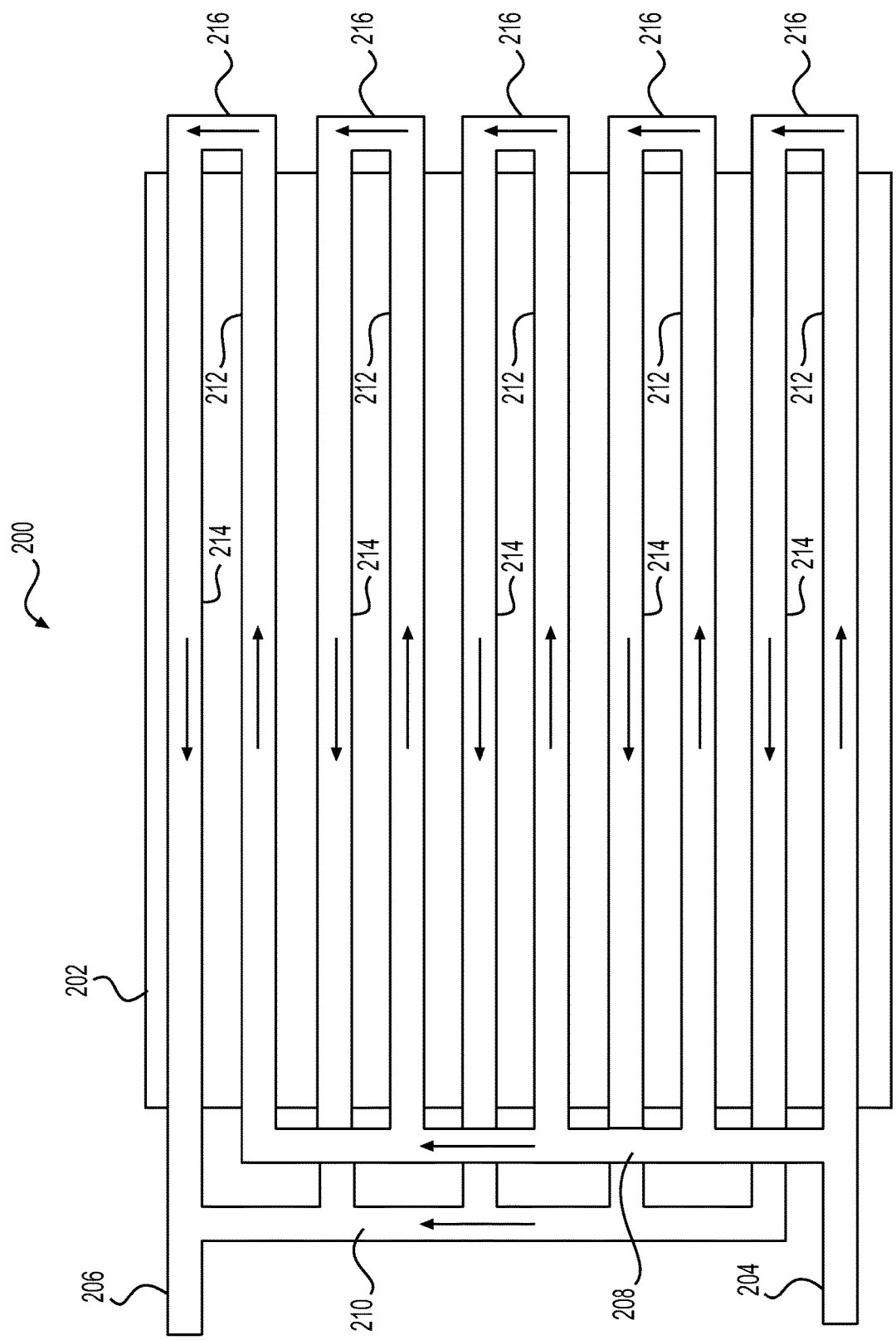
FIG. 4 is a schematic diagram of a multi-flow air-to-liquid heat exchanger.
Figure 5:
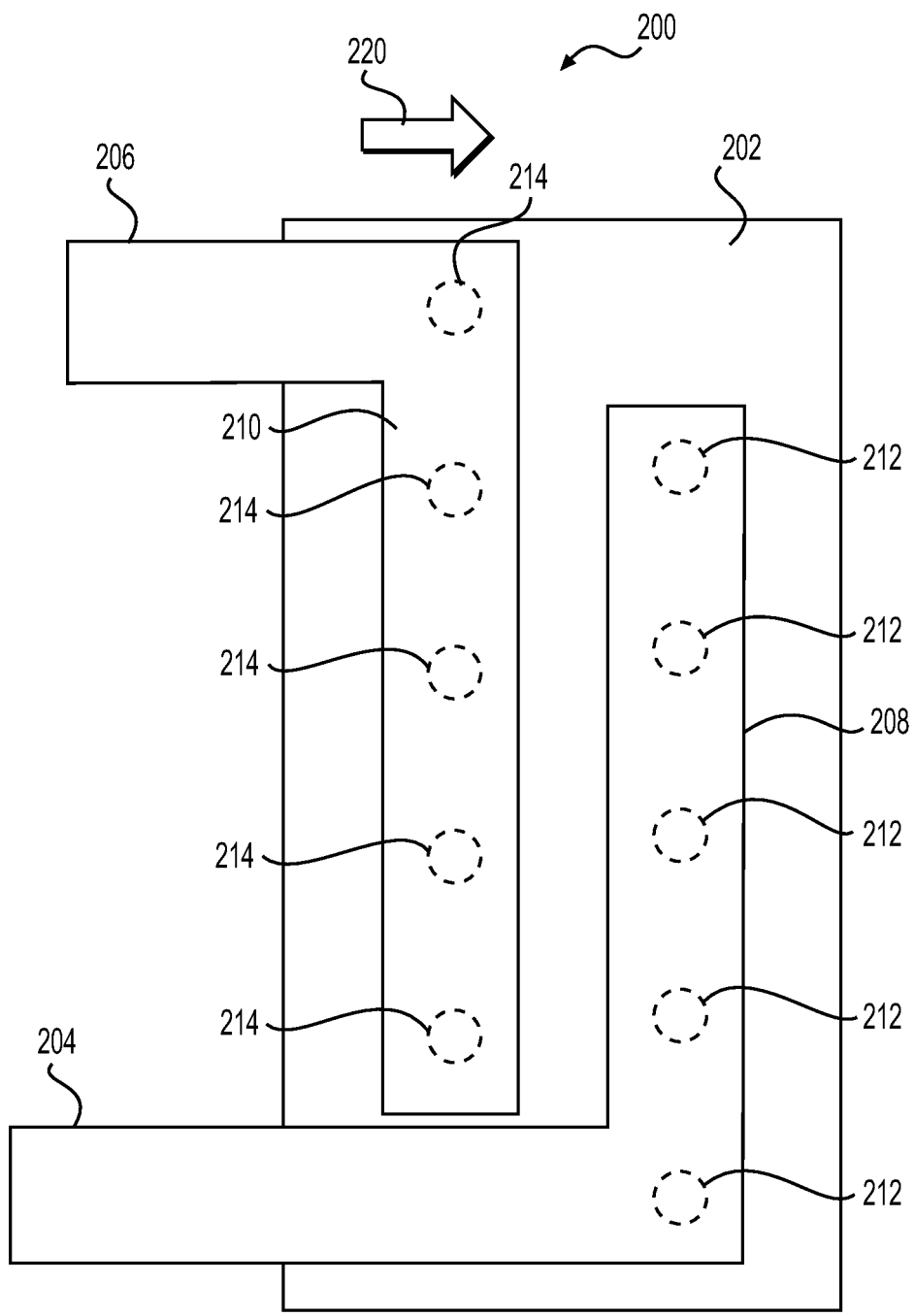
FIG. 5 is a schematic side-view of the multi-flow air-to-liquid heat exchanger of FIG. 4.

The first and second open loops $540_A$ and $540_B$ as illustrated respectively comprise first and second dual-flow air-to-liquid heat exchangers $300_A$ and $300_B$. These dual-flow air-to-liquid heat exchangers $300_A$ and $300_B$ represent a modest increase in size, particularly an increased thickness, when compared to the single-flow heat exchangers 100 used in the configuration of FIG. 7. They however provide a large increase in cooling efficiency while remaining significantly thinner than the multi-flow air-to-liquid heat exchanger 200 of FIG. 4. Although FIG. 8 shows the dual-flow air-to-liquid heat exchangers $300_A$ and $300_B$, mounting first and second single-flow heat exchangers $100_A$ and $100_B$ on the server rack 500, as a part of the cooling arrangement 350, is also contemplated.

The fan or fans 12 contained within each server housing 502 provide forced air cooling to the equipment mounted in the server housings 502 and generate an airflow directed toward the corresponding pair of dual-flow air-to-liquid heat exchangers $300_A$ and $300_B$. Each one of the first and second dual-flow air-to-liquid heat exchangers $300_A$ and $300_B$ may be configured for reducing a temperature of the air expelled from the corresponding server housing 502 to less than a maximum rated air temperature to maintain a safe operating temperature of the corresponding server housing 502 on which it is mounted when the other one of the first and second dual-flow air-to-liquid heat exchangers $300_A$ and $300_B$ is taken out of service for maintenance or as a result from an equipment failure. Redundancy of the forced air cooling may be obtained by providing at least two fans 12 in each server housing 502, the at least two fans 12 receiving electrical power from two distinct electrical sources.

FIG. 10 also shows that the air-to-liquid heat exchangers $300_A$, $300_B$ may be mounted on the server rack 500 by use of a pair of hinges 506 mounted on a lateral side of the first frame $302_A$, the hinges 506 being adapted for pivotally mounting the air-to-liquid heat exchangers $300_A$, $300_B$ on the rack 10. Optionally, additional hinges may be installed between the two hinges 506 as shown. The particular configuration of FIG. 10 shows that the hinges 506 are located on the same side of the air-to-liquid heat exchangers $300_A$, $300_B$ where the liquid inlets $306_A$, $306_B$ and the liquid outlets $308_A$, $308_B$ are also located. This configuration facilitates pivoting of the air-to-liquid heat exchangers $300_A$, $300_B$ about the hinges 506. Mounting the cooling arrangement 300 of FIG. 7 on a rack using the hinges 506 is also contemplated. It may be noted that, in some implementations the fans 12 installed in each server housing may be mounted on a fan plate (not shown) physically connected to the server rack 500 by use of additional hinges (not shown) that may be located on a same side as the hinges 506 or on an opposite side. When the hinges of the fan plate and the hinges 506 are on the same side and share a common pivot axis, the fan plate and the air-to-liquid heat exchangers $300_A$, $300_B$ may be configured to rotate independently or as a single block. Mounting the air-to-liquid heat exchangers $300_A$, $300_B$ on the rack 500 using the hinges 506 allows access to the fans 12 for maintenance purposes. Rotating the fan plate in this manner may be useful in providing access to network connectivity devices, hard disk drives, electrical connections and hydraulic connections within the rack 500.

Also shown on FIG. 10 is a temperature sensor 508 mounted on an external face $326_B$ of the dual-flow second air-to-liquid heat exchanger $300_B$. The temperature sensor 508 may measure and transmit a temperature of air having flowed through the first and second dual-flow air-to-liquid heat exchangers $300_A$, $300_B$ to a remote monitoring device (not shown). The server rack 500 may comprise a plurality of additional sensors (not shown) for providing various temperature, liquid flow, and pressure measurements to the remote monitoring device, the temperature sensor 508 and these additional sensors sharing a common communication link (not shown) for forwarding their measurements to the remote monitoring device. A position of the temperature sensor 508 on the external face $326_B$ of the second dual-flow air-to-liquid heat exchanger $300_B$ may vary horizontally and/or vertically, given that the temperature of the air having flowed through the first and second dual-flow air-to-liquid heat exchangers $300_A$, $300_B$ substantially homogeneous, as will be illustrated on FIG. 14. Mounting the temperature sensor 508 on an external face of the second air-to-liquid heat exchanger $100_B$ of the cooling arrangement 300 is also contemplated.

On FIGS. 8 and 10, a liquid inlet $306_A$ and a liquid outlet $308_A$ are connected on a same side of a frame $302_A$, and a liquid inlet $306_B$ and a liquid outlet $308_B$ are connected on a same side of the frame $302_B$. Additionally, the liquid inlets $306_A$ and $306_B$ are located on a same side of the cooling arrangement 350. An alternate configuration in which the liquid inlets $306_A$ and $306_B$ are located on opposite sides of the cooling arrangement 350 is also contemplated.

As best seen on FIG. 10, in a particular non-limiting configuration, the first dual-flow air-to-liquid heat exchanger $300_A$ comprises a first continuous internal conduit $304_A$ forming a first plurality of interconnected parallel sections (not shown) and a third continuous internal conduit $314_A$ forming a third plurality of interconnected parallel sections (not shown). The first and third pluralities of interconnected parallel sections extend within the first frame $302_A$. The first and third continuous internal conduits $304_A$ and $314_A$ connect the first liquid inlet $306_A$ to the first liquid outlet $308_A$. Likewise, the second dual-flow air-to-liquid heat exchanger $300_B$ comprises a second continuous internal conduit $304_B$ forming a second plurality of interconnected parallel sections (not shown) and a fourth continuous internal conduit $314_B$ forming a fourth plurality of interconnected parallel sections (not shown), the second and fourth pluralities of interconnected parallel sections extending within the second frame $302_B$. The second and fourth continuous internal conduits $304_B$ and $314_B$ connect the second liquid inlet $306_B$ to the second liquid outlet $308_B$.

As illustrated, a first portion of the first plurality of interconnected parallel sections is located in a first plane $316_A$ within the first frame $302_A$ and a second portion of the first plurality of interconnected parallel sections is located in a second plane $318_A$ within the first frame $302_A$, the second plane $318_A$ being parallel to the first plane $316_A$. Conversely, a first portion of the third plurality of interconnected parallel sections is located in the second plane $318_A$ within the first frame $302_A$ and a second portion of the third plurality of interconnected parallel sections is located in the first plane $316_A$ within the first frame $302_A$. The third continuous internal conduit $314_A$ and the first continuous internal conduit $304_A$, both change between the first plane $316_A$ and the second plane $318_A$ at a crossing point $324_A$. Variants of the first dual-flow air-to-liquid heat exchanger $300_A$ may include one or more crossing points $324_A$ and may alternatively have no such crossing point.

Likewise, a first portion of the second plurality of interconnected parallel sections is located in a third plane $316_B$ within the second frame $302_B$ and a second portion of the second plurality of interconnected parallel sections is located in a fourth plane $318_B$ within the second frame $302_B$, the fourth plane $318_B$ being parallel to the third plane $316_B$. Conversely, a first portion of the fourth plurality of interconnected parallel sections is located in the fourth plane $318_B$ within the second frame $302_B$ and a second portion of the fourth plurality of interconnected parallel sections is located in the third plane $316_B$ within the second frame $302_B$. The fourth continuous internal conduit $314_B$ and the second continuous internal conduit $304_B$, both change between the third plane $316_B$ and the fourth plane $318_B$ at a crossing point $324_B$. Variants of the second dual-flow air-to-liquid heat exchanger $300_B$ may include one or more crossing points $324_B$ and may alternatively have no such crossing point. The first and second dual-flow air-to-liquid heat exchangers $300_A$, $300_B$ of the cooling arrangement 350 may have different numbers of crossing points $324_A$ or $324_B$.

In the open loop $540_A$, the air-to-liquid heat exchanger $300_A$ is fed via a cold supply line $320_A$ with cold liquid from an external source to reduce a temperature of the air expelled from the rack 500 by the fans 12. The air-to-liquid heat exchanger $300_B$ in the open loop $540_B$ is either fed by the cold supply line $320_A$ or by another cold supply line (not shown). A temperature of the liquid flowing out of the liquid outlets $308_A$ and $308_B$ is modestly increased by the transfer of heat from the air expelled from the server rack 500; for explanation purposes, the liquid flowing out of the open loops $540_A$ and $540_B$ may be characterized as a 'warm' liquid. In contrast, the liquid flowing out of the water blocks 250 has a considerably higher temperature. As a result, the warm liquid at the output of the open loops $540_A$ and $540_B$ is used to provide cooling to the closed loops $510_A$ and $510_B$. To this end, the closed loops $510_A$ and $510_B$ are respectively thermally connected to the open loops $540_A$ and $540_B$.

As best seen on FIG. 10, the liquid inlet $306_A$ of each air-to-liquid heat exchanger $300_A$ is connected to the first cold supply line $320_A$ and the liquid outlet $308_A$ of the air-to-liquid heat exchanger $300_A$ is connected to a first warm liquid line $322_A$. Although not shown, the liquid inlet $306_B$ of air-to-liquid heat exchanger $300_B$ may be connected to the first cold supply line $320_A$ or to another cold supply line (not shown). The liquid outlet $308_B$ of air-to-liquid heat exchanger $300_B$ is connected to a second warm liquid line (not shown) similar to the first warm liquid line $322_A$. As shown on FIG. 11, the first and second warm liquid lines respectively deliver the warm liquid from the liquid outlets $308_A$ and $308_B$ to secondary sides of the liquid-to-liquid heat exchangers $514_A$ and $514_B$. The first warm liquid line $322_A$ is fluidly connected via a valve $570_A$ to a liquid inlet $542_A$ of a secondary side $544_A$ of the liquid-to-liquid heat exchanger $514_A$.

The primary side $512_A$ and the secondary side $544_A$ of the liquid-to-liquid heat exchanger $514_A$ are thermally coupled for transfer of heat from the primary side $512_A$ to the secondary side $544_A$ when a temperature of the first primary side $512_A$ is higher than a temperature of the secondary side $544_A$. In operation, the primary side $512_A$ receives the hot liquid from one or more water blocks 250 and its temperature is significantly higher than that of the warm liquid received in the secondary side $544_A$. Therefore, the liquid-to-liquid heat exchanger $514_A$ transfers heat from its primary side $512_A$ to the secondary side $544_A$. The warm liquid received at the liquid inlet $542_A$ of the secondary side $544_A$ is heated before being expelled from the secondary side $544_A$ via a liquid outlet $546_A$. The heated liquid flows from the liquid outlet $546_A$ via a valve $572_A$ and leaves the open loop $540_A$ via a hot return line $550_A$. The open loop $540_A$ may be taken out of service by closing the valves $570_A$ and $572_A$. The open loop $540_B$ is constructed in the same manner; it can also be taken out of service by closing valves $570_B$ and $572_B$. It may be noted that the air-to-liquid heat exchangers $300_A$ may be substituted with the air-to-liquid heat exchangers $100_A$; the same is true for the air-to-liquid heat exchangers $300_B$ that may be substituted with the air-to-liquid heat exchangers $100_B$. For example and without limitation, in the open loop $540_A$, water may be received on the cold supply line $320_A$ at 30 degrees. The water is heated by the dual-flow air-liquid heat exchangers $300_A$ to a temperature of 34.5 degrees in the first warm liquid line $322_A$. In the same example, water is supplied by the primary side $512_A$ of the liquid-to-liquid heat exchanger $514_A$ to the water blocks 250 at 40 degrees, the water reaching a temperature of 50 degrees when returning to the primary side $512_A$. Thermal exchange from the primary side $512_A$ to the secondary side $544_A$ of the liquid-to-liquid heat exchanger $514_A$ causes the water in the open loop $540_A$ to reach a temperature of 45 degrees in the hot return line $550_A$ while causing the water in the closed loop $510_A$ to reach the above-mentioned temperature of 40 degrees at the liquid inlet $518_A$ of the primary side $512_A$. It may be noted that, in cold climates, the high temperature of the liquid flowing in the hot return line $550_A$ could be considered for heat recovery purposes.

Although not shown on FIG. 11, two distinct pumps may be mounted in series for redundancy and/or for increasing the flow of the liquid circulating within the closed loop $510_A$. Likewise, two liquid-to-liquid heat exchangers may be mounted so that their primary sides are connected in series or in parallel within the closed loop $510_A$ and so that their secondary sides are connected in series or in parallel within the open loop $540_A$. The use of two liquid-to-liquid heat exchangers allows extracting more thermal energy from the water blocks 250 within the closed loop $510_A$.

Also not shown on FIG. 11, the closed loop $510_B$ and the open loop $540_B$ are connected in a similar manner as expressed in the discussion of the closed loop $510_A$ and the open loop $540_A$. The heated liquid flowing from the liquid outlet of the secondary side of the liquid-to-liquid heat exchanger $514_B$, at the junction of the closed loop $510_B$ and the open loop $540_B$, may leave the cooling arrangement via the hot return line $550_A$ or via another hot return line. It may be noted that although the above description of FIGS. 8-11 indicates that the open loop $510_A$ is only connected to the closed loop $510_A$ and that the open loop $540_B$ is only connected to the closed loop $510_B$, other configurations are also contemplated. For example and without limitation, the liquid outlets $308_A$ and $308_B$ of the air-to-liquid heat exchangers $300_A$ and $300_B$ could all be connected to common same warm liquid line $322_A$ feeding both secondary sides of the liquid-to-liquid heat exchangers $514_A$ and $514_B$. Configurations having distinct numbers of open loops and distinct numbers of closed loops are also contemplated; in an embodiment, the number of open loops may differ from the number of closed loops.

Figure 13:
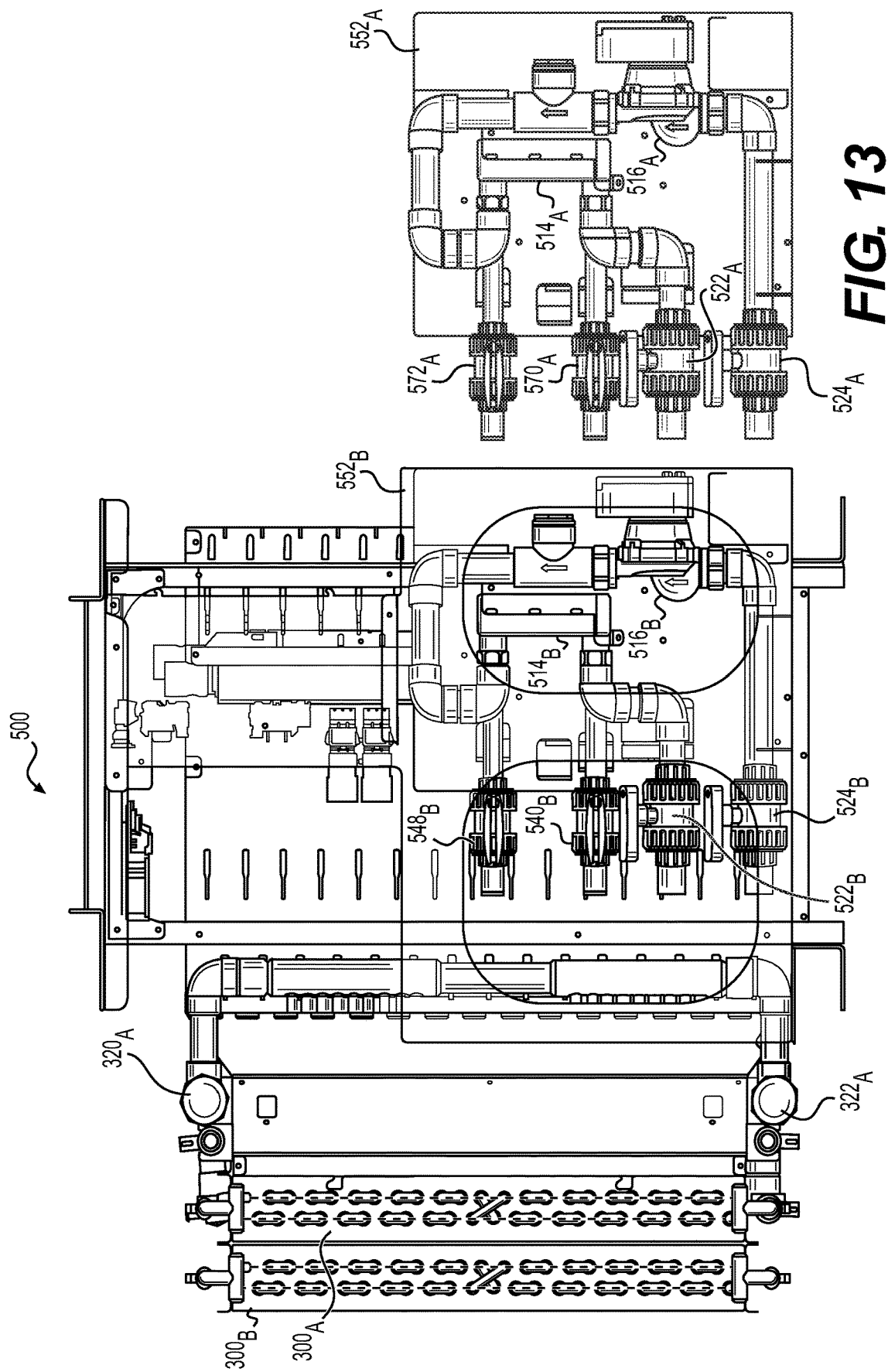
FIG. 13 is another side elevation view of the server rack of FIGS. 8 and 9 showing a removal of a module in accordance with an embodiment of the present technology.

In the non-limiting configuration of FIGS. 8, 9 and 10, the liquid-to-liquid heat exchangers, the pumps and the valves included in the closed loops, the valves in fluidic connection between the air-to-liquid heat exchangers and the liquid-to-liquid heat exchangers are all located within the subframe 504. FIG. 13 is another side elevation view of the server rack of FIGS. 8 and 9 showing a removal of a module in accordance with an embodiment of the present technology. The components contained in the subframe 504 may be grouped in two modules $552_A$ and $552_B$. The module $552_A$ contains the liquid-to-liquid heat exchanger $514_A$, the pump $516_A$, the valves $522_A$, $524_A$, $570_A$ and $572_A$, and tubing connection these various components. The module $552_B$ contains the liquid-to-liquid heat exchanger $514_B$, the pump $516_B$, the valves $522_B$, $524_B$, $570_B$ and $572_B$, and tubing connection these various components. When all valves contained in one of the modules $552_A$ or $552_B$ are closed, and as the corresponding pump $516_A$ or $516_B$ is turned off, that module $552_A$ or $552_B$ may be removed from the subframe 504 for maintenance purposes, as shown on FIG. 13. It may be noted that, in some embodiments, the valves $522_A$, $524_A$, $570_A$ and $572_A$ (resp. $522_B$, $524_B$, $570_B$ and $572_B$) are fixed parts of the tubing connections beyond the module $552_A$ (resp. $552_B$), and in this case, the module $552_A$ (resp. $552_B$) should be drained from its liquid before it may be removed from the subframe 504.

Various embodiments may comprise the inclusion of additional redundant components for enhanced cooling reliability. For example, in a non-limiting embodiment, the liquid-to-liquid heat exchanger $514_A$ (resp. $514_B$) of the module $552_A$ (resp. $552_B$) may be replaced by two liquid-to-liquid heat exchangers $514_A$ (resp. $514_B$) fluidly connected either in series or in parallel configurations. In the same or another embodiment the pump $516_A$ (resp. $516_B$) of the module $552_A$ (resp. $552_B$) may be replaced by a pair of two pumps $516_A$ (resp. $516_B$) fluidly connected in series. The pumps of the pair may be electrically connected to distinct and independent electrical sources for redundancy purposes. One pump of the pair may run while the other is off. In the same or another embodiment, each valve $522_A$, $524_A$, $570_A$ and $572_A$ (resp. $522_B$, $524_B$, $570_B$ and $572_B$) may be replaced by a pair of valves fluidly connected in series for security purposes, a first valve of each pair belonging to the module $552_A$ (resp. $552_B$), a second valve of the pair staying attached to the piping beyond the first valve. In the same or another embodiment, the modules $552_A$ and $552_B$ may be connected to the same closed loop $510_A$ and to the same open loop $540_A$ by means of T-piping elements located outside the modules $552_A$ and $552_B$. In such an embodiment, the two modules $552_A$ and $552_B$ may be fluidly connected in parallel regarding the closed loop $510_A$ and the open loop $540_A$. Finally, in the same or another embodiment, a same liquid may be used in the closed loops $510_A$ and $510_B$ and in the open loops $540_A$ and $540_B$, for example water. In such an embodiment, the closed loop $510_A$ (resp. $510_B$) may initially be filled in liquid using a pressure regulator (not shown) installed in the module $552_A$ (resp. $552_B$) and connected between the closed loop $510_A$ (resp. $510_B$) and the open loop $540_A$ (resp. $540_B$). The open loops $540_A$ and $540_B$ may thus become a liquid source for the closed loops $510_A$ and $510_B$ when needed. In a similar way, a pressure relief valve (not shown) may be installed in the module $552_A$ (resp. $552_B$) and connected between the closed loop $510_A$ (resp. $510_B$) and the open loop $540_A$ (resp. $540_B$). In case of an excessive pressure in the closed loop $510_A$ (resp. $510_B$), the liquid may be expelled into the open loop $540_A$ (resp. $540_B$). It may be noted that other piping elements may be present in the modules $552_A$ and $552_B$. Though not shown in the different Figures, filters may be disposed in various piping, check valves may be placed after the pumps $516_A$ and $516_B$, and expansion tanks may be used to attenuate variations of pressure in the closed loops $510_A$ and $510_B$.

One or two external pumps of one or two pumping substations (not shown) provide a continuous flow of cold liquid delivered to the cooling arrangement 350 via the cold supply line or lines $320_A$ and $320_B$, and retrieve heated liquid from the cooling arrangement 350 via the hot return line or lines. The external pumps ensure a continuous flow of the liquid between the cooling arrangement 350 and a cold outlet and a hot inlet of further cooling equipment, for example a dry cooler (not shown), located outside of the data center.

Figure 14:
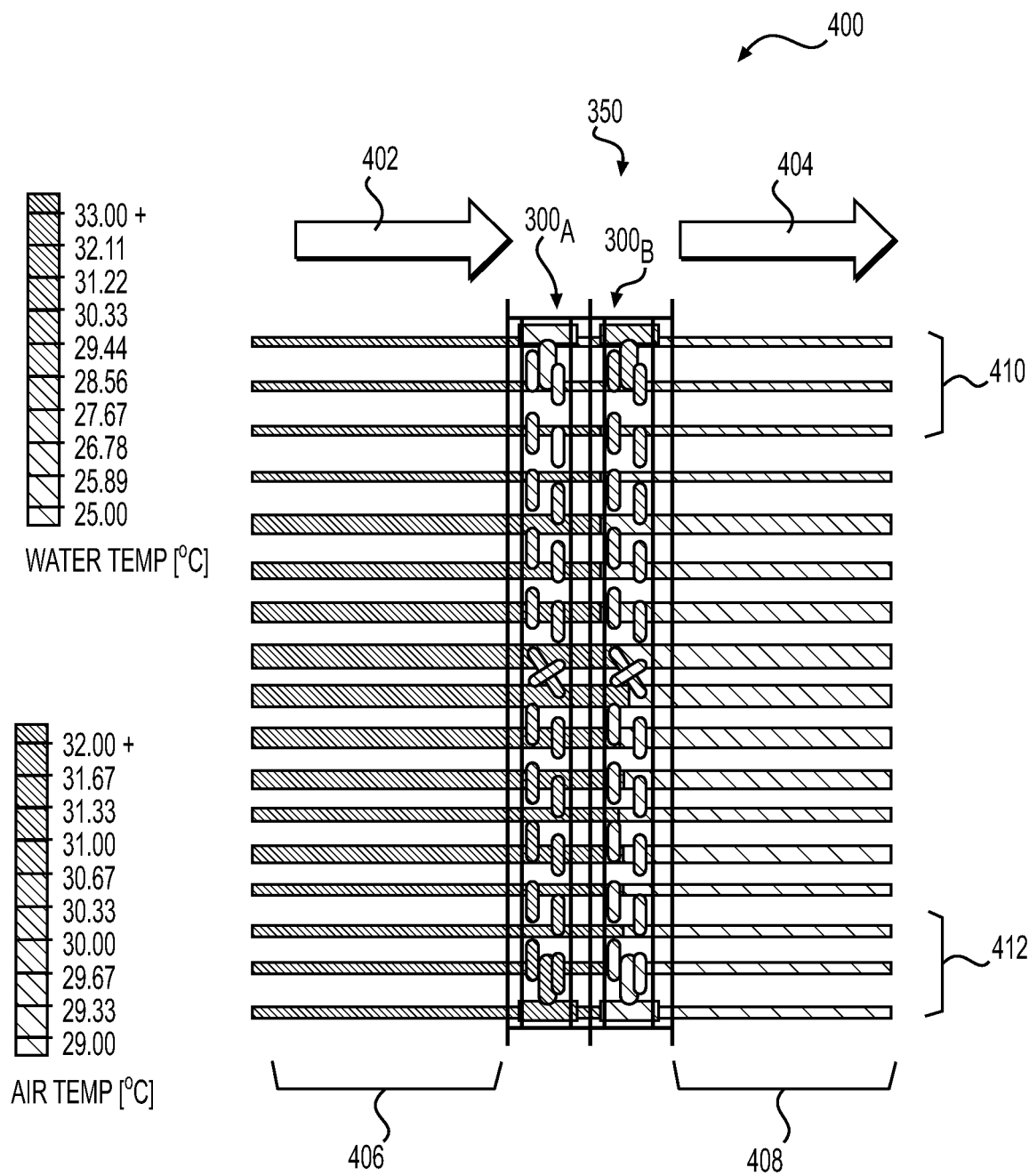
FIG. 14 is a visual representation of a homogeneous temperature pattern of an airflow expelled from dual-flow air-liquid heat exchangers assembled in an anti-parallel configuration in accordance with an embodiment of the present technology.

FIG. 14 is a visual representation of a homogeneous temperature pattern of an airflow expelled from dual-flow air-liquid heat exchangers assembled in an anti-parallel configuration in accordance with an embodiment of the present technology. A diagram 400 illustrates a temperature of a flow of air determined in a simulation environment, before and after passing through the cooling arrangement 350. The air flows in the direction of arrows 402 and 404. In a first zone 406 upstream of the cooling arrangement 350, a temperature of the airflow is high due to the generation of heat in the server rack 10, being for example at about 40 degrees. The temperature of the airflow is substantially uniform within the first zone 406. Cold water is received at the top of the first dual-flow air-liquid heat exchanger $300_A$, at a temperature of about 25 degrees. Upper strata 410 of the air flowing downstream of the first dual-flow air-liquid heat exchanger $300_A$ are cooled to about 30 degrees. A temperature of the water flowing through the first dual-flow air-liquid heat exchanger $300_A$ increases as it passes through the various interconnected parallel sections $110_A$, being continuously exposed to the 40 degrees airflow. The water reaches about 33 degrees the bottom of the first dual-flow air-liquid heat exchanger $300_A$. Consequently, the airflow between the first and second dual-flow air-liquid heat exchangers $300_A$, $300_B$ has a stratified, heterogeneous temperature profile in which lower strata 412 of the air flowing downstream of the first dual-flow air-liquid heat exchanger $300_A$ are only cooled to about 37 degrees.

The same airflow immediately reaches the second dual-flow air-liquid heat exchanger $300_B$. Cold water is received at the bottom of the second dual-flow air-liquid heat exchanger $300_B$, also at a temperature of about 25 degrees. Lower strata 412 of the airflow, which have been cooled to a limited extent to about 37 degrees when flowing through the dual-flow first air-liquid heat exchanger $300_A$, receive maximum cooling from the dual-flow second air-liquid heat exchanger $300_B$ and reach a temperature of about 30 degrees. Upper strata 410 of the airflow, which have been cooled to a larger extent to about 30 degrees when flowing through the first dual-flow air-liquid heat exchanger $300_A$, receive a modest level of cooling from the second dual-flow air-liquid heat exchanger $300_B$ to also reach a temperature of about 29 degrees. As a result, the same airflow having passed through the second dual-flow air-liquid heat exchanger $300_B$ has a substantially homogeneous temperature profile and all strata of the airflow expelled from the cooling arrangement 350 in a zone 408 are at a substantially uniform temperature of about 30 degrees. The water also reaches about 29 degrees the top of the second dual-flow air-liquid heat exchanger $300_B$.

Figure 3:
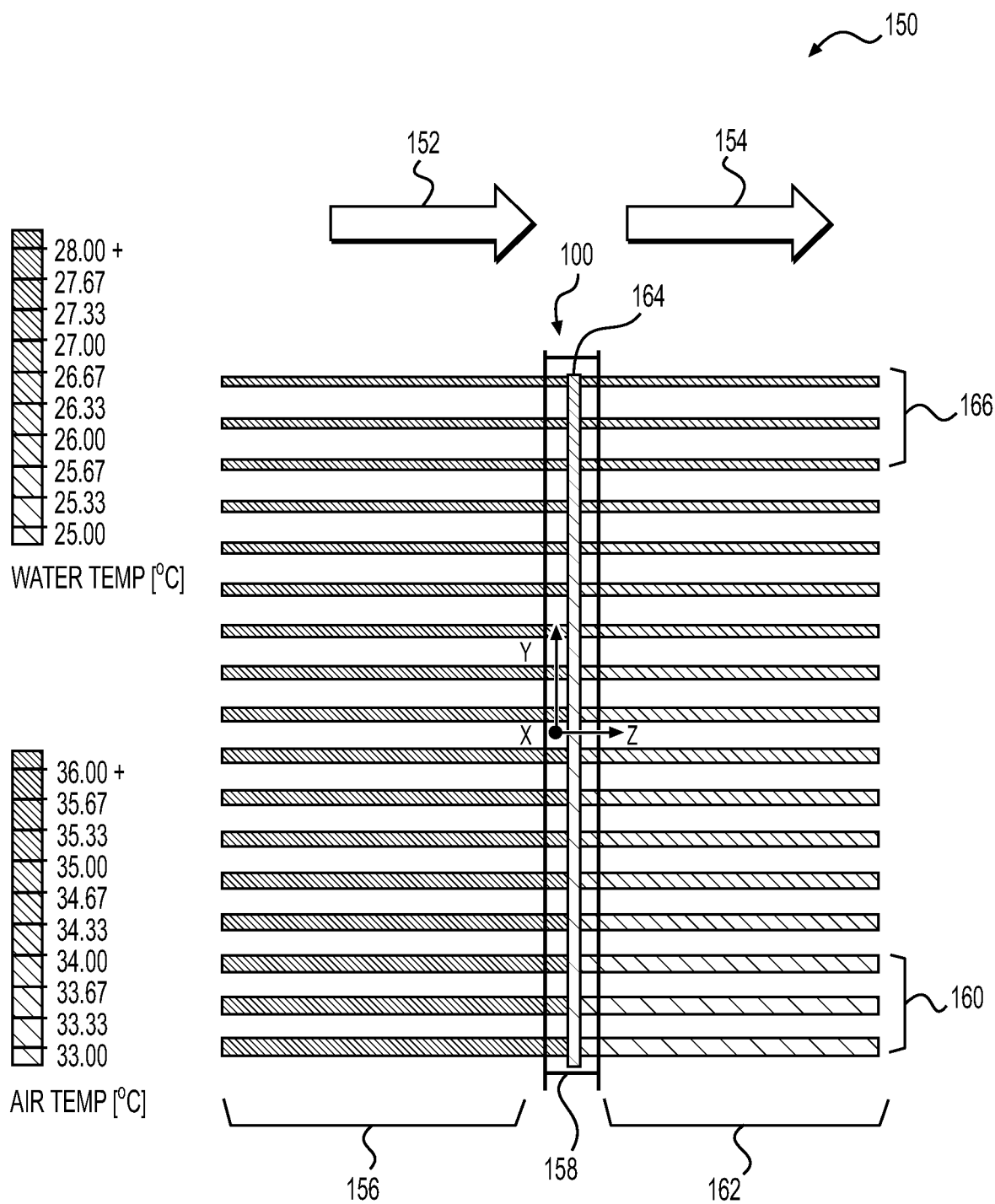
FIG. 3 is a visual representation of a stratified temperature pattern of an airflow expelled from the single-flow air-to-liquid heat exchanger of FIG. 2.

Referring again to FIG. 3, the diagram 150 illustrates results obtained when using the single-flow heat exchanger 100. In contrast, the diagram 400 illustrates results obtained when using a pair of dual-flow heat exchangers $300_A$, $300_B$. These results are not directly comparable due to the respective cooling capacities of these different heat exchangers. However, while the numerical absolute temperature values shown on FIGS. 3 and 14 cannot be directly compared, the difference in the airflow temperature patterns is striking: while FIG. 3 shows an important stratification of the temperature pattern, FIG. 14 shows uniformity and homogeneity of the temperature in all strata of the airflow expelled from the cooling arrangement 350. It may be noted that using a pair of single-flow heat exchangers mounted in anti-parallel fashion would arguably produce a lesser decrease of the airflow temperature, but would nevertheless provide homogeneity of the temperature in all strata of the resulting airflow. In contrast, using a single dual-flow heat exchanger would still result in a stratified, heterogeneous temperature profile of the resulting airflow.

In summary, the cooling configuration illustrated on the various view of FIGS. 8 to 12 fluidly connects in series the air-to-liquid heat exchangers $100_A$ and $100_B$, or $300_A$ and $300_B$, of the rack 500 to the secondary sides of the liquid-to-liquid heat exchangers $514_A$ and $514_B$ mounted to the same rack 500. This configuration may be compared to a more traditional cooling arrangement in which the cooling needs of a plurality of racks are served by larger components, including a dedicated pumping sub-station for air-to-liquid heat exchangers, further outside cooling equipment (e.g. dry coolers), further including dedicated pumping sub-stations for liquid cooling within the racks, and large liquid-to-liquid heat exchangers.

Experimentations were made using the present cooling configuration, in which water was used as a cooling liquid.

These experimentations have shown a 50% reduction of a number of piping lines within a data center. As illustrated in the example of FIG. 11, a temperature difference between the cold supply line $320_A$ and the hot return line $550_A$ was equal to about 15 degrees, which compares to a typical difference of about 5 degrees obtained using a conventional configuration and is indicative of a far better heat transfer performance. Given this increase of the temperature gradient between the cold supply line $320_A$ and the hot return line $550_A$, the flow of water required to cool the rack 500 was reduced so the nominal diameter of the cold supply line $320_A$ and of the hot return line $550_A$ was reduced from 4 inches to 2.5 inches. The thermal efficiency of dry coolers used as external cooling units receiving the return water from the hot return line $550_A$ and returning cold water via the cold supply line $320_A$ was increased by more than 33% and it was possible to operate such dry coolers without adding any evaporative cooling A total number of pumping stations was reduced by 25%. Capital expenses required to provide the same cooling capacity as when using a conventional configuration were reduced by 25%, despite the fact that traditional polyvinyl chloride (PVC) piping was replaced with stainless steel and copper piping for enhanced reliability. Operating expenses in terms of electrical power required to drive various pumps and fans was reduced by more than 50%.

The present technology is amenable to implementations in data centers and other computing facilities in which various racks having distinct ratios of air-cooling and liquid-cooling capabilities. In many implementations, impacts of eventual cooling equipment failures are constrained to a single rack and are limited by the redundancy of many components.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement for autonomous cooling of a rack hosting a plurality of components and at least one fan, characterized in that the cooling arrangement comprises:
    a first closed loop comprising:
        a plurality of liquid cooling units thermally coupled to a plurality of heat-generating units of the plurality of components, each of the plurality of heat-generating units corresponding to one of the plurality of components and each of the plurality of liquid cooling units being thermally coupled to one of the plurality of heat-generating units and comprising a first liquid channel adapted for transferring heat from the corresponding one of the plurality of heat-generating units to a first liquid flowing in the corresponding first liquid channel,
        a first primary side of a first liquid-to-liquid heat exchanger, the first primary side being fluidly connected to the first liquid channel of each of the plurality of liquid cooling units, and
        a first pump fluidly connected between the first primary side of the first liquid-to-liquid heat exchanger and each of the plurality of liquid cooling units, the first pump being adapted for causing the first liquid to flow within the first closed loop;
    a first open loop comprising:
        a first air-to-liquid heat exchanger mounted to the rack so that heated air expelled from the rack by the at least one fan flows through the first air-to-liquid heat exchanger, the first air-to-liquid heat exchanger being adapted to receive a second liquid from a first cold supply line, and
        a first secondary side of the first liquid-to-liquid heat exchanger, the first secondary side being thermally coupled to the first primary side for transfer of heat from the first primary side to the first secondary side when a temperature of the first primary side is higher than a temperature of the first secondary side, the first secondary side being fluidly connected to the first air-to-liquid heat exchanger, the first secondary side being adapted for receiving the second liquid from an outlet of the first air-to-liquid heat exchanger and returning the second liquid to a first hot return line.

2. The cooling arrangement of claim 1, wherein the first cold supply line is adapted for being connected to a cold outlet of a dry cooler and the first hot return line is adapted for being connected to a hot inlet of the dry cooler.

3. The cooling arrangement of claim 1, wherein:
    the first liquid channel of each of the plurality of liquid cooling units extends between a first liquid inlet and a first liquid outlet of the corresponding one of the plurality of liquid cooling units;
    the first primary side of the first liquid-to-liquid heat exchanger comprises a second liquid inlet fluidly connected to the first liquid outlet of each of the plurality of liquid cooling units, the first primary side further comprising a second liquid outlet fluidly connected to the first liquid inlet of each of the plurality of liquid cooling units;
    the first air-to-liquid heat exchanger comprises a third liquid inlet adapted to receive the second liquid from the first cold supply line, the first air-to-liquid heat exchanger further comprising a third liquid outlet; and
    the first secondary side of the first liquid-to-liquid heat exchanger comprises a fourth liquid inlet fluidly connected to the third liquid outlet of the first air-to-liquid heat exchanger and a fourth liquid outlet adapted for returning the second liquid to the first hot return line.

4. The cooling arrangement of claim 3, wherein the rack has a generally rectangular perimeter, the first air-to-liquid heat exchanger being positioned on a first side of the rack, the cooling arrangement further comprising a subframe adapted to be mounted on a second side of the rack perpendicular to the first side, the subframe being configured to receive:
    the first liquid-to-liquid heat exchanger;
    the first pump being connected to the second liquid inlet of the first primary side of the first liquid-to-liquid heat exchanger;
    a first valve within a connection extending from the first liquid outlet of each of the plurality of liquid cooling units to the first pump;
    a second valve within a fluid connection extending from the second liquid outlet of the first primary side of the first liquid-to-liquid heat exchanger to the first liquid inlet of each of the plurality of liquid cooling units;

a third valve within a fluid connection extending from the third liquid outlet of the first air-to-liquid heat exchanger to the fourth liquid inlet of the first secondary side of the first liquid-to-liquid heat exchanger; and a fourth valve within a fluid connection extending from the fourth liquid outlet of the first secondary side of the first liquid-to-liquid heat exchanger to the first hot return line.

5. The cooling arrangement of claim 3, further comprising:

a second closed loop comprising:
a plurality of second liquid channels of the plurality of liquid cooling units, each of the plurality of second liquid channels being comprised by one of the plurality of liquid cooling units and being adapted for transferring heat from the heat-generating unit to a third liquid flowing in the second liquid channel of the corresponding one of the plurality of liquid cooling units;
a second primary side of a second liquid-to-liquid heat exchanger, the second primary side being fluidly connected to each of the plurality of second liquid channels of the plurality of liquid cooling units, and
a second pump fluidly connected between the second primary side of the second liquid-to-liquid heat exchanger and each of the plurality of liquid cooling units, the second pump being adapted for causing the third liquid to flow within the second closed loop; and a second open loop comprising:
a second air-to-liquid heat exchanger mounted to the rack so that air having flowed through the first air-to-liquid heat exchanger flows through the second air-to-liquid heat exchanger, the second air-to-liquid heat exchanger being adapted to receive a fourth liquid from the first cold supply line or from a second cold supply line, and
a second secondary side of the second liquid-to-liquid heat exchanger, the second secondary side being thermally coupled to the second primary side for transfer of heat from the second primary side to the second secondary side when a temperature of the second primary side is higher than a temperature of the second secondary side, the second secondary side being fluidly connected to the second air-to-liquid heat exchanger, the second secondary side being adapted for returning the fourth liquid to the first hot return line or to a second hot return line.

6. The cooling arrangement of claim 5, wherein:
each of the plurality of the second liquid channels of each of the plurality of the liquid cooling units extends between a fifth liquid inlet and a fifth liquid outlet of the corresponding one of the plurality of liquid cooling units;
the second primary side of the second liquid-to-liquid heat exchanger comprises a sixth liquid inlet fluidly connected to the fifth liquid outlet of each of the plurality of liquid cooling units, the second primary side further comprising a sixth liquid outlet fluidly connected to the fifth liquid inlet of each of the plurality of liquid cooling units;
the second air-to-liquid heat exchanger comprises a seventh liquid inlet adapted to receive the fourth liquid from the first cold supply line or from the second cold supply line, the second air-to-liquid heat exchanger further comprising a seventh liquid outlet; and
the second secondary side of the second liquid-to-liquid heat exchanger comprises an eighth liquid inlet fluidly connected to the seventh liquid outlet of the second air-to-liquid heat exchanger and an eighth liquid outlet adapted for returning the second liquid to the first hot return line or to the second hot return line.

7. The cooling arrangement of claim 6, wherein the rack has a generally rectangular perimeter, the first air-to-liquid heat exchanger being positioned on a first side of the rack, the cooling arrangement further comprising a subframe adapted to be mounted on a second side of the rack perpendicular to the first side, the subframe being configured to receive:

a first module comprising:
the first liquid-to-liquid heat exchanger;
the first pump being connected to the second liquid inlet of the first primary side of the first liquid-to-liquid heat exchanger;
a first valve within a connection extending from the first liquid outlet of each of the plurality of liquid cooling units to the first pump;
a second valve within a fluid connection extending from the second liquid outlet of the first primary side of the first liquid-to-liquid heat exchanger to the first liquid inlet of each of the plurality of liquid cooling units;
a third valve within a fluid connection extending from the third liquid outlet of the first air-to-liquid heat exchanger to the fourth liquid inlet of the first secondary side of the first liquid-to-liquid heat exchanger; and
a fourth valve within a fluid connection extending from the fourth liquid outlet of the first secondary side of the first liquid-to-liquid heat exchanger to the first hot return line; and a second module comprising:
the second liquid-to-liquid heat exchanger;
the second pump being connected to the sixth liquid inlet of the second primary side of the second liquid-to-liquid heat exchanger;
a fifth valve within a connection extending from the fifth liquid outlet of each of the plurality of liquid cooling units to the second pump;
a sixth valve within a fluid connection extending from the sixth liquid outlet of the second primary side of the second liquid-to-liquid heat exchanger to the fifth liquid inlet of each of the plurality of liquid cooling units;
a seventh valve within a fluid connection extending from the seventh liquid outlet of the second air-to-liquid heat exchanger to the eighth liquid inlet of the second secondary side of the second liquid-to-liquid heat exchanger; and
an eighth valve within a fluid connection extending from the eighth liquid outlet of the second secondary side of the second liquid-to-liquid heat exchanger to the first hot return line or to the second hot return line.

8. The cooling arrangement of claim 7, wherein:
the first closed loop and the first open loop are taken out of service by closing the first, second, third and fourth valves and by turning off the first pump; and
the second closed loop and the second open loop are taken out of service by closing the fifth, sixth, seventh and eighth valves and by turning off the second pump.

9. The cooling arrangement of claim 7, wherein:
the first closed loop and the first open loop are configured to provide sufficient cooling for maintaining a temperature of the at least one component to less than a safe temperature threshold when the second closed loop and the second open loop are taken out of service;
the second closed loop and the second open loop are configured to provide sufficient cooling for maintaining the temperature of the plurality of components to less than the safe temperature threshold when the first closed loop and the first open loop are taken out of service.

10. The cooling arrangement of claim 5, wherein the second liquid-to-liquid heat exchanger is a plate heat exchanger.

11. The cooling arrangement of claim 1, wherein the first liquid-to-liquid heat exchanger is a plate heat exchanger.

12. The cooling arrangement of claim 1, wherein:
the rack comprises a plurality of server housings, each of the server housing hosting at least one component;
the at least one fan comprises at least one fan mounted in each of the server housings;
the first open loop comprises a plurality of air-to-liquid heat exchangers mounted to the rack so that heated air expelled by the at least one fan of each server housing flows through a corresponding one of the plurality of air-to-liquid heat exchangers;
each of the plurality of air-to-liquid heat exchangers is adapted to receive liquid from the first cold supply line; and
the first secondary side of the first liquid-to-liquid heat exchanger is fluidly connected to each of the plurality of air-to-liquid heat exchangers.

* * * * *